United States Patent
Hsu et al.

(10) Patent No.: US 11,579,524 B2
(45) Date of Patent: Feb. 14, 2023

(54) ELECTROCHEMICAL IMPRINTING OF MICRO- AND NANO-STRUCTURES IN POROUS SILICON, SILICON, AND OTHER SEMICONDUCTORS

(71) Applicants: ARIZONA BOARD OF REGENTS ON BEHALF OF ARIZONA STATE UNIVERSITY, Scottsdale, AZ (US); THE BOARD OF TRUSTEES OF THE UNIVERSITY OF ILLINOIS, Urbana, IL (US)

(72) Inventors: Keng Hsu, Tempe, AZ (US); Placid Ferreira, Champaign, IL (US); Bruno Azeredo, Champaign, IL (US)

(73) Assignees: ARIZONA BOARD OF REGENTS ON BEHALF OF ARIZONA STATE UNIVERSITY, Scottsdale, AZ (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 17/517,952

(22) Filed: Nov. 3, 2021

(65) Prior Publication Data
US 2022/0128902 A1 Apr. 28, 2022

Related U.S. Application Data

(63) Continuation of application No. 16/479,490, filed as application No. PCT/US2018/015576 on Jan. 26, 2018, now abandoned.
(Continued)

(51) Int. Cl.
G03F 7/00 (2006.01)
H01L 21/027 (2006.01)
H01L 21/3063 (2006.01)

(52) U.S. Cl.
CPC ........ *G03F 7/0002* (2013.01); *H01L 21/0273* (2013.01); *H01L 21/3063* (2013.01)

(58) Field of Classification Search
CPC ............... G03F 7/0002; H01L 21/0273; H01L 21/3063; H01L 21/30604; H01L 21/32134
See application file for complete search history.

(56) References Cited

U.S. PATENT DOCUMENTS

2008/0230773 A1* 9/2008 Dickey ............... B82Y 40/00
                                                             252/511
2009/0050487 A1   2/2009 Fang et al.
(Continued)

FOREIGN PATENT DOCUMENTS

WO   WO2017035442 A1   3/2017
WO   WO2017143013 A1   8/2017

OTHER PUBLICATIONS

Azeredo et al., "Direct imprinting of porous silicon via metal-assisted chemical etching," Advanced Functional Materials, 2016, vol. 26, pp. 2929-2939 (Year: 2016).*
(Continued)

*Primary Examiner* — Mohammed R Alam
(74) *Attorney, Agent, or Firm* — Michael Best & Friedrich LLP

(57) ABSTRACT

An imprinting platform including a noble metal catalyst, a semiconductor substrate, and a pre-patterned polymer stamp, where the catalyst is attached to the stamp, and related methods and articles.

15 Claims, 16 Drawing Sheets

Related U.S. Application Data

(60) Provisional application No. 62/451,416, filed on Jan. 27, 2017.

(56) References Cited

U.S. PATENT DOCUMENTS

| | | |
|---|---|---|
| 2009/0140458 A1 | 6/2009 | Xu et al. |
| 2010/0075108 A1* | 3/2010 | Verschuuren ......... G03F 7/0002 428/156 |
| 2010/0104852 A1 | 4/2010 | Fletcher et al. |
| 2010/0109201 A1 | 5/2010 | Fletcher et al. |
| 2013/0020278 A1* | 1/2013 | Park .................... B81C 1/00031 216/11 |
| 2014/0314897 A1* | 10/2014 | Ahn ....................... B82Y 40/00 427/383.1 |
| 2016/0020112 A1* | 1/2016 | Oh ..................... H01L 21/67092 438/689 |
| 2017/0072633 A1 | 3/2017 | Hsu |
| 2018/0185955 A1 | 7/2018 | Hsu et al. |
| 2019/0039137 A1 | 2/2019 | Hildreth et al. |

OTHER PUBLICATIONS

Ahn et al., "Large-Area Roll-to-Roll and Roll-to-Plate Nanoimprint Lithography: A Step toward High-Throughput Application of Continuous Nanoimprinting" ACS Nano 2009, 3, 8.
Azeredo et al., "Direct Electrochemical Imprinting of Sinusoidal Linear Gratings into Silicon", Proceedings of the 2016 Manufacturing Science and Engineering Conference, Jul. 2016, Blacksburg, VA.
Azeredo et al., "Direct Imprinting of 3D Micro-Optic Elements Into Porous Silicon via Metal-Assisted Chemical Etching", submitted to the proceedings of the Porous Semiconductors—Science and Technology Conference (PSST), Tarragona, Spain, 2016 (Best Talk of the Day Award).
Azeredo et al., "Direct Imprinting of 2.5D Porous Silicon Nanostructures with Metal-Assisted Chemical Etching", (Invited Talk) Materials Research Society Meeting, San Francisco, CA, 2015.
Azeredo et al., "Direct imprinting of porous silicon via metal-assisted chemical etching," Advanced Functional Materials, 2016, vol. 26, pp. 2929-2939.
Azeredo et al., "Metal assisted Chemical Imprinting of 2.5D Silicon Nanostructures", ASME 2014 International Mechanical Engineering Congress, Montreal, CN, 2014.
Azeredo et al., "Metal assisted Electrochemical Stamping for Semiconductor Photonic Devices", ASME 2014 International Mechanical Engineering Congress, Montreal, CN, 2014.
Azeredo et al., "Silicon nanowires with controlled sidewall profile and roughness fabricated by thin-film dewetting and metalassisted chemical etching," Nanotechnology, vol. 24, No. 22, p. 225305, 2013.
Azimi et al., "Buried centimeter-long micro- and nanochannel arrays in porous silicon and glass," Lab Chip 2014, 14, 2081.
Balasundaram et al., "Photonic crystal membrane reflectors by magnetic field-guided metal-assisted chemical etching," Applied Physics Letters, vol. 103, p. 214103, 2013.
Balasundaram et al., "Porosity control in metal-assisted chemical etching of degenerately doped silicon nanowires," Nanotechnology 2012, 23, 30.
Chang et al., "Densely Packed Arrays of Ultra-High-Aspect-Ratio Silicon Nanowires Fabricated using Block-Copolymer Lithography and Metal-Assisted Etching," Advanced Functional Materials, vol. 19, pp. 2495-2500, 2009.
Chang et al., "Ultra-high aspect ratio high-resolution nanofabrication for hard X-ray diffractive optics," Nat. Commun. 2014, 5, 4243.
Chartier et al., "Metal-assisted chemical etching of silicon in HF—H2O2," Electrochim. Acta 2008, 53, 17.
Chiappini et al., "Biodegradable Nanoneedles for Localized Delivery of Nanoparticles in Vivo: Exploring the Biointerface," ACS Nano 2015, 9, 5.
Cho et al., "Nanoscale Origami for 3D Optics," Small 2011, 7, 1943.
Choi et al., "Synthesis of Silicon Nanowires and Nanofin Arrays Using Interference Lithography and Catalytic Etching," Nanoletters, vol. 8, No. 11, pp. 3799-3802, 2008.
Chou et al., "Imprint of sub-25 nm vias and trenches in polymers," Appl. Phys. Lett. 1995, 67, 3114.
Cunin et al., "Biomolecular screening with encoded porous-silicon photonic crystals," Nature Materials, 2002, 1, 39.
Flavel et al., "Micropatterned Arrays of Porous Silicon: Toward Sensory Biointerfaces," ACS Appl. Mater. Interfaces 2011, 3, 7.
Feser et al., "Thermal conductivity of silicon nanowire arrays with controlled roughness," Journal of Applied Physics 2012, 112(11), 114306.
Geyer et al., "Influence of the doping level on the porosity of silicon nanowires prepared by metal-assisted chemical etching," Nanotechnology 2015, 26, 24.
Geyer et al., "Model for the Mass Transport during Metal-Assisted Chemical Etching with Contiguous Metal Films as Catalysts," Physical Chemistry C, vol. 116, No. 24, pp. 13446-13451, 2012.
Guo, "Nanoimprint Lithography: Methods and Material Requirements," Adv. Mater. 2007, 19, 4.
Han et al., "Metal-assisted chemical etching of silicon and nanotechnology applications," Nano Today 2014, 9, 3.
Hildreth et al., "3D Out-of-Plane Rotational Etching with Pinned Catalysts in Metal-Assisted Chemical Etching of Silicon," Advanced Functional Materials, vol. 21, pp. 3119-3128, 2011.
Hildreth et al., "3D Spirals with Controlled Chirality Fabricated Using Metal-Assisted Chemical Etching of Silicon," ACS Nano, vol. 6, No. 11, pp. 10004-10012, 2012.
Hirschman et al., "Silicon-based visible light-emitting devices integrated into microelectronic circuits," Nature 1996, 384.
Huang et al., "Fabrication of Silicon Nanowire Arrays with Controlled Diameter,Length, and Density," Advanced Materials, vol. 19, pp. 744-748, 2007.
Huang et al., "Metal-Assisted Chemical Etching of Silicon: A Review," Adv. Mat. 2011, 23, 2.
International Preliminary Report on Patentability for Application No. PCT/US2018/015576 dated Aug. 8, 2019 (8 pages).
International Search Report and Written Opinion for Application No. PCT/US2018/015576 dated May 11, 2018 (10 pages).
Jane et al., "Porous silicon biosensors on the advance," Trends Biotechnol. 2009, 27, 4.
Karger et al., in Handbook of Porous Silicon (Ed: L. Canham), Springer International Publishing, Cham, Switzerland, 2014, pp. 221.
Keating, in Handbook of Porous Silicon (Ed: L. Canham), Springer International Publishing, Cham, Switzerland, 2014, pp. 531.
Kolasinski et al., "The mechanism of galvanic/metal-assisted etching of silicon," Nanoscale Res. Lett. 2014, 9, 432.
Kolasinski et al., "The stoichiometry of metal assisted etching (MAE) of Si in V2O5+HF and HOOH+HF solutions," Electrochim. Acta 2015, 158, 219.
Lai et al., "Mechanics of Catalyst Motion during Metal Assisted Chemical Etching of Silicon," Physical Chemistry C, vol. 117, No. 40, pp. 20802-20809, 2013.
Lai et al., "Metal assisted anodic etching of silicon," Nanoscale 2015, 7, 11123.
Li et al., "Charge Transport in Uniform Metal-Assisted Chemical Etching for 3D High-Aspect-Ratio Micro- and Nanofabrication on Silicon," ECSJ. Solid State Sci. Technol. 2015, 4, 9.
Li et al., "Metal assisted chemical etching for high aspect ratio nanostructures: A review of characteristics and applications in photovoltaics," Current Opinion in Solid State and Materials Science 2012, 16, 2.
Li et al., "Uniform Vertical Trench Etching on Silicon with High Aspect Ratio by Metal-Assisted Chemical Etching Using Nanoporous Catalysts," ACS Appl. Mater. Interfaces 2014, 6, 1.
Liu et al., "Anisotropic Nanoparticles as Shape-Directing Catalysts for the Chemical Etching of Silicon," J. Am. Chem. Soc. 2013, 735, 12196.
Lucklum et al., "Highly insulating, fully porous silicon substrates for high temperature micro-hotplates," Sens. Actuators, A 2014, 213.

(56) References Cited

OTHER PUBLICATIONS

Mares et al., "Shape-engineered multifunctional porous silicon nanoparticles by direct imprinting", Nanotechnology, 2015, vol. 26, Article No. 271001, internal pp. 1-8.

Ning et al., "Transfer-Printing of Tunable Porous Silicon Microcavities with Embedded Emitters," ACS Photonics 2014, 1, 11.

Oh et al., "Magnetically Guided Nano-Micro Shaping and Slicing of Silicon," Nanoletters, vol. 12, No. 4, pp. 2045-2050, 2012.

Park et al., "Biodegradable luminescent porous silicon nanoparticles for in vivo applications," Nat. Mater. 2009, 8.

Ruminski et al., "Topological Control of Porous Silicon Photonic Crystals by Microcontact Prinitng," Adv. Opt. Mater. 2013, 1, 7.

Ryckman et al., "Direct Imprinting of Porous Substrates: A Rapid and Low-Cost Approach for Patterning Porous Nanomaterials," Nanoletters, vol. 11, No. 5, pp. 1857-1862, 2011.

Ryckman et al., "Porous silicon structures for low-cost diffraction-based biosensing," Appl. Phys. Lett. 2010, 96.

Ryckman et al., "Three-dimensional patterning and morphological control of porous nanomaterials by gray-scale direct imprinting," Scientific Reports, 2013, vol. 3, Article No. 1502.

Rykaczewski et al., "Guided Three-Dimensional Catalyst Folding during Metal-Assisted Chemical Etching of Silicon," Nanoletters, vol. 11, No. 6, pp. 2369-2374, 2011.

Sirbuly et al., "Patterned Microstructures of Porous Silicon by Dry-Removal Soft Lithography," Adv. Mater. 2003, 15, 2.

Sun et al., "High-performance, Flexible hydrogen sensors that use carbon nanotubes decorated with palladium nanoparticles," Adv. Mater. 2007, 19.

Tasciotti et al., "Mesoporous silicon particles as a multistage delivery system for imaging and therapeutic applications," Nat. Mater. 2008, 3.

Torralba et al., "3D patterning of silicon by contact etching with anodically biased nanoporous gold electrodes," Electrochemistry Communications, 2017, vol. 76, pp. 79-82.

\* cited by examiner

ELECTROCHEMICAL IMPRINTING OF MICRO- AND NANO-STRUCTURES IN POROUS SILICON, SILICON, AND OTHER SEMICONDUCTORS

CROSS-REFERENCE TO RELATED APPLICATIONS

This application claims the benefit of U.S. Provisional Application No. 62/451,416 filed on Jan. 27, 2017, which is incorporated herein by reference.

STATEMENT REGARDING FEDERALLY SPONSORED RESEARCH

This invention was made with government support under grant number 1200780, awarded by the National Science Foundation. The government has certain rights in the invention.

TECHNICAL FIELD

The present invention pertains to patterning a substrate. More particularly, the present invention pertains to the 2.5D and 3D patterning of silicon.

BACKGROUND OF THE INVENTION

Two-dimensional microscale patterning of porous silicon (PS) offers many opportunities for exploiting its optical properties through on-chip and heterogeneous integration. Applications in optoelectronics, photonics, microthermal systems, lab on a chip, biodegradable materials, in vivo bioimaging, drug delivery, and biosensing are derived from such integration. However, micro- and nano-patterning of PS has remained a challenge due to the inability of standard microfabrication processes (e.g., photolithography, wet etching, and dry etching) to effectively pattern PS.

SUMMARY OF THE INVENTION

In one embodiment, the invention provides an imprinting platform including a noble metal catalyst, a semiconductor substrate, and a pre-patterned polymer stamp, where the catalyst is attached to the stamp.

In another embodiment, the invention provides a method of patterning silicon, which utilizes an imprinting platform that includes a noble metal catalyst, a semiconductor substrate, and a pre-patterned polymer stamp, where the catalyst is attached to the stamp.

In yet another embodiment, the invention provides an article produced by a method of patterning silicon, which includes an imprinting platform that includes a noble metal catalyst, a semiconductor substrate, and a pre-patterned polymer stamp, where the catalyst is attached to the stamp.

Other aspects of the invention will become apparent by consideration of the detailed description and accompanying drawings.

DETAILED DESCRIPTION

Figure 1:
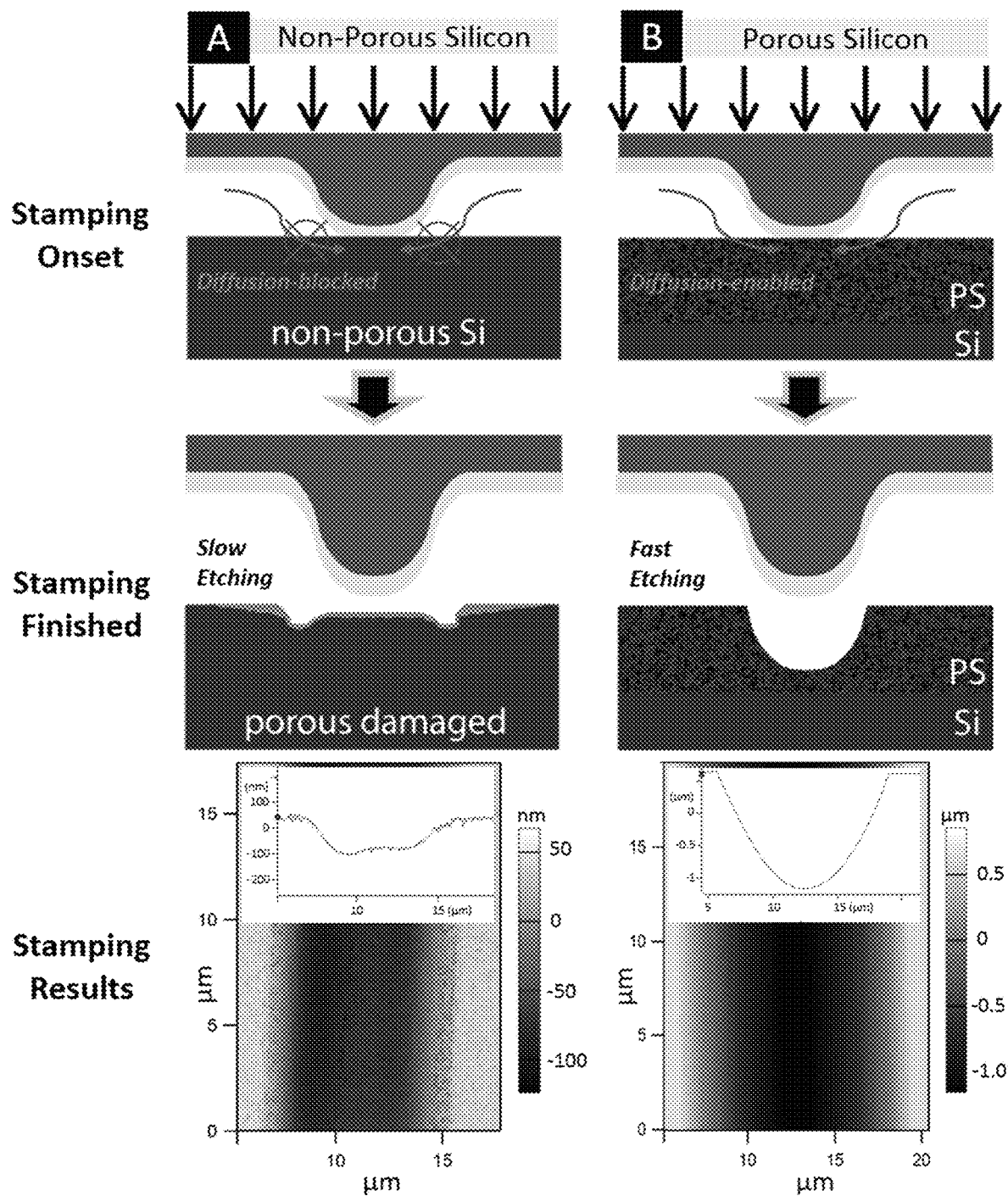
FIG. 1 is a comparison of an imprinting profile for porous vs. non-porous substrates. A) Shown are schematics of a stamping operation onto a non-porous silicon (Si) wafer in which the substrates does not take the shape of the stamp. Instead, growth of PS surrounding the catalyst-substrate interface in a "double-dip" pattern is shown (top and middle). B) Shown are schematics of a stamping operation onto PS in which the substrate takes the shape of the stamp (top and middle). Finally, the bottom row depicts atomic force microscopy (AFM) scans of imprinted surfaces and corresponding cross-sectional profiles (insets) for non-porous (part A) and porous (part B) Si substrates. Process A leads to etch depths nearly 10 times smaller than process B.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Traditional approaches to patterning silicon (Si) do not extend to porous silicon (PS) because of the permeability and reactivity of PS. During photolithography and micromachining, photoresist; developers; and etchants typically infiltrate the pores, leading to contamination of the substrate, poor sidewall control, and over-etching, and in general, poor fidelity of pattern transfer.

A route to bypass these issues is to perform lithography prior to anodization. The patterned photoresist film is used as a mask during the anodization step, leading to 2D embedded PS patterns with micron-scale resolution. However, cost-effective wet-etching processes, such as KOH, cannot selectively etch PS since multiple crystal facets are exposed. Recipes for dry etching methods must be specifically tailored to a particular pore morphology of the PS being etched, and dry etching methods seldom successfully lead to high-aspect ratio features.

To circumvent these issues, micro-contact printing (MP), dry-removal soft-lithography (DWSL), and direct imprinting of PS (DIPS) methods have been developed to pattern PS. The MP method uses a stamp that blocks diffusion of reactants during anodization of the Si surface. As a result, it offers a few degrees of freedom for 3D patterning and, thus, is limited to fabricating shallow corrugated patterns. The latter two patterning methods exploit the controlled fracturing or collapsing of the brittle porous material to selectively strip or compress PS. While DWSL is restricted to 2D patterning with microscale resolution, DIPS can generate 3D features with sub-100 nm resolution. DIPS, however, relies on the compaction of PS, leading to permanent deformation of the substrate and, thus, spatially modifying the porous morphology and the optical properties of the substrate. While this characteristic can be advantageous for certain applications, a low-stress patterning method that does not damage the pore morphology has not been heretofore demonstrated.

Oftentimes, it is also desirable to avoid photolithography and deep reactive ion etching (DRIE) to reduce complexity and cost of manufacturing PS. Metal-assisted chemical etching (MACE) is one alternative, directional wet etching method for semiconductors. Unlike its alternatives, MACE can "cut through" all crystal planes selectively, making it a good candidate for the development of an imprinting process. In the case of patterning Si, it can produce high aspect-ratio (greater than 100) features with sub-10 nm resolution, and it can produce a tunable sidewall profile with taper ranging from 0° to 13°.

A large portion of current MACE research focuses on understanding defect generation, namely pores that are created in the substrate. Moreover, while pore formation in Si can be obtained via MACE during the etching process, the range of pore morphologies is limited and often dependent upon the doping concentration and ratio of oxidizing to reducing species. This ratio ($\rho$) is typically defined as the molarity of hydrofluoric acid (HF) divided by the molarity of HF and the oxidizer (e.g., $H_2O_2$).

There is a balance between (a) charge transfer (CT) kinetics at the catalyst-Si interface, and (b) the rate of diffusion of reactants and products towards or away from that same interface. The ratio of these rates governs the relative rate of anisotropic etching to porosity generation. While the rate of electron-hole injection can be controlled by tuning the concentration of the reducing agent, the diffusion can be promoted in various ways: (a) adding pores/cracks to catalyst thin-film, (b) reducing the length of the diffusion pathways (e.g., small widths of catalyst patterns), and (c) increasing porosity of the substrate. In fact, MACE of low-doped Si can be said to be stable in the sense that increasing CT kinetics leads to increased porosity on the substrate (directly underneath the catalyst), promoting diffusion of Si-etching reactants and decreasing the rate of porosity generation.

Efforts to improve the scalability of MACE as a manufacturing method, and to extend its capability to control the catalyst motion in three dimensions, are needed. On the one hand, thin-film based MACE still relies on 2D templating techniques to pattern the catalyst, techniques such as photolithography, e-beam lithography, interference lithography, thin-film dewetting, nanosphere lithography, and block-copolymer lithography. Since the catalyst cannot be reused, a new noble metal thin-film catalyst must be patterned for each new sample. This characteristic adds to the processing complexity, generates waste, and makes MACE's cost and scalability a function of other processes. Furthermore, the lithographic patterning must be compatible with PS, which may lead to the aforementioned challenges. While there has been some success in the control the catalyst etch direction to achieve 3D features via magnetic-assisted MACE and engineering the catalyst motion, these approaches have limited control over the span of 3D features they can produce and have not thus far had high repeatability.

The aforementioned issues are addressed herein by the development of a high-throughput, chemical imprint process, referred to as "Mac-Imprint", that uses MACE for patterning PS. Like some other implementation of MACE, it is capable of centimeter-scale parallel patterning with sub-20 nm nanometer resolution. Unlike them, however, it avoids a need for lithographic patterning of the metal catalyst for each substrate by using a reusable imprinting stamp. Further, unlike purely mechanical imprinting processes for PS, Mac-Imprint uses minimal mechanical forces so that no resulting plastic deformation or residual stresses occur.

In certain embodiments, Mac-Imprint uses a noble metal-coated stamp immersed in HF and $H_2O_2$ solution and brought in contact with a Si substrate to selectively induce etching of PS at the contact interfaces. The 3D pattern transfer fidelity between stamp and substrate is compared herein across different thicknesses of the porous layer on a Si substrate. As detailed below, when there is no porous layer on the substrate (i.e., for etching single crystal Si), the shape of the stamp is not transferred into the substrate with discernable fidelity. Instead, etching of the substrate is observed at the edges of the contact interface. Nonetheless, the high-pattern transfer fidelity observed for substrates with porous layers strongly suggests that the substrate porosity allows for the diffusion of reactants and reaction products to and away from the contact interface.

It is also detailed below how the etch rate is limited by the local mass-transport and depletion of the reactants in the vicinity of the contact interface between the stamp and substrate. The disclosed PS direct chemical imprinting technique is shown to be capable of producing curvilinear features with mirror quality finish, including microscale sinusoidal and parabolic surfaces, for example.

Furthermore, upon coating with a reflective film, these geometries can form microscale optical elements with the ability to split the light spectrum or focus light. Parabolic concentrators are disclosed in detail and are shown to focus light near the diffraction limit. Additionally, novel capabilities are introduced, such as catalyst reuse with sequential-stamping configurations. Among other things, the disclosed imprint process skips the need for photolithography and dry etching methods, and operates in ambient conditions. Such advantages could be used to facilitate the commercialization of novel PS-based technologies.

One aspect of the invention provides a low-cost, low-stress, ambient, and high-throughput chemical nanoimprint approach to patterning smooth 3D curvilinear PS surfaces in a single imprinting operation. As a demonstration of this process, sinusoidal and parabolic surfaces with potential uses as diffraction gratings and concentrators were fabricated to demonstrate potential on-chip micro-optical components.

In another aspect, the present disclosure provides details on a novel imprinting platform to directly pattern PS and single-crystal Si that relies solely on the catalysis of wet chemical reactions to selectively etch bulk semiconductors (e.g., wafers), avoiding the use of processes that involve plastic deformation and high-temperature processing. Further, the disclosed platform can operate at room temperature and/or utilize earth-abundant and low cost chemicals, all of which can lower processing costs.

The versatility of the direct imprinting technique disclosed herein is demonstrated by, for example, its ability to produce curvilinear and complex 2.5D features (e.g., paraboloids, parabolic cylinders, sinusoidal waves, and straight sidewall channels). Embodiments of the invention can pattern these geometries in a single step, which can lower the manufacturing cost of products requiring these patterning capabilities.

Moreover, pattern repeatability and resolution is intrinsically higher with chemical imprinting compared to competing methods, such as dry etching methods. For example, chemical imprinting can be done in ambient conditions without the need for vacuum processing and/or can require a simpler and less expensive apparatus.

Fundamentals of Electrochemical Imprinting

In an imprinting or stamping process, the objective is to transfer the shape of the reusable stamp into the substrate. For MACE, highly-localized etching of Si is produced at the contact interface between the metal catalyst and Si. Hence for imprinting (notwithstanding the changes in the geometry of the contact and reactant access to the interface between metal catalyst and Si) one would expect similar localized etching of Si to the contact interface, resulting in transfer of the shape of the stamp to the substrate, since the underlying reaction mechanism remain unchanged.

Figure 2:
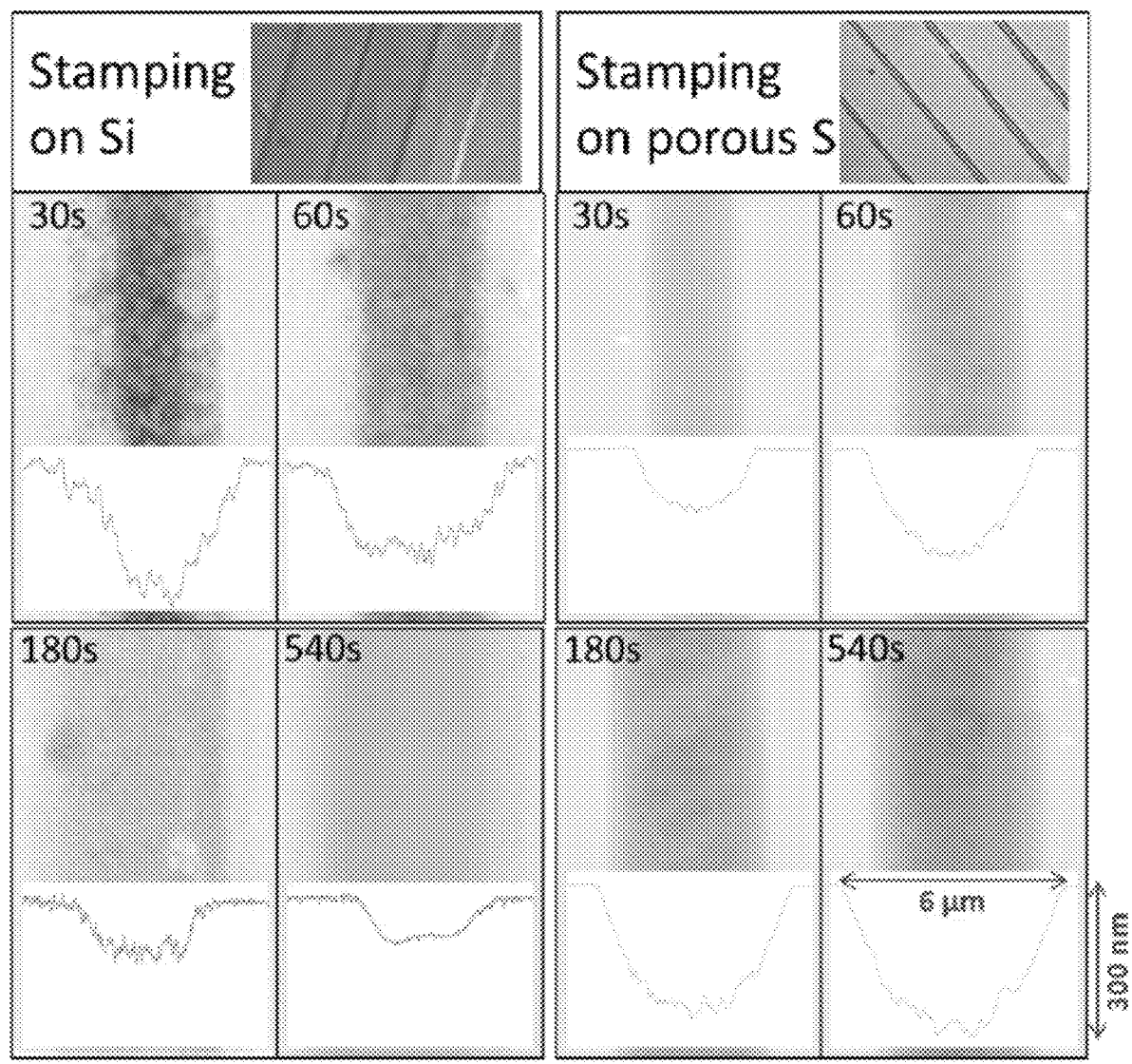
FIG. 2 depicts the evolution of the etch profile of a substrate upon imprinting with a parabolic cylinder stamp for the case of etching Si (left) and PS (right) for different times, as labeled.

However, when imprinting directly onto a (nonporous) Si substrate, a pattern of PS develops directly beneath and around the contact interface. Additionally, at the end of an etching cycle, the topography of the surface generated does not resemble that of the stamp (FIGS. 1 and 2). Over-etching of the Si around the edges of the contact interface leads to a "double-dip" cross-sectional profile (FIG. 1A). These observations suggest that in the absence of sufficient diffusion pathways for reactants to reach the Si/gold (Au) contact interface, for example, PS formation around the edges of the contact interface is accelerated relative to the directional and localized etching of Si. Given that the stamp is impervious to the etchants, as the etch progresses and a contact interface with sufficient lateral dimension (e.g., greater than 1 μm) develops, no pathways are left for diffusion to its center.

The same uneven etch profile from the edge to the center of the contact interface as observed in thin-film-based MACE was observed along with the concomitant reduction in etch rate. Indeed, in all trials involving non-porous Si, imprinting stopped at a depth between about 100 nm and about 300 nm, independent of etch time, without achieving fidelity between the etched profile and the stamp profile.

FIG. 1B shows a schematic of the process and the results of imprinting PS. With a layer of PS on the substrate, the process yielded consistent, high-fidelity imprinting of the stamp geometry into the substrate. Besides faithful imprinting results, the volume of PS removed for a given etch time greatly increased, and the process was observed to continue imprinting to depths of about a few microns (limited only by the height of the features on the stamps). All process conditions being the same in the two cases of imprinting on porous and nonporous Si substrates, it can be inferred that the porous nature of the substrate facilitates the mass transport of reactants and products to and from the contact interface, making it possible for the etching reaction to continue while remaining localized at the contact interface between the stamp and substrate. Without the porous domain, the process not only stalls but also fails to replicate the topography of the stamp on the substrate.

Figure 3:
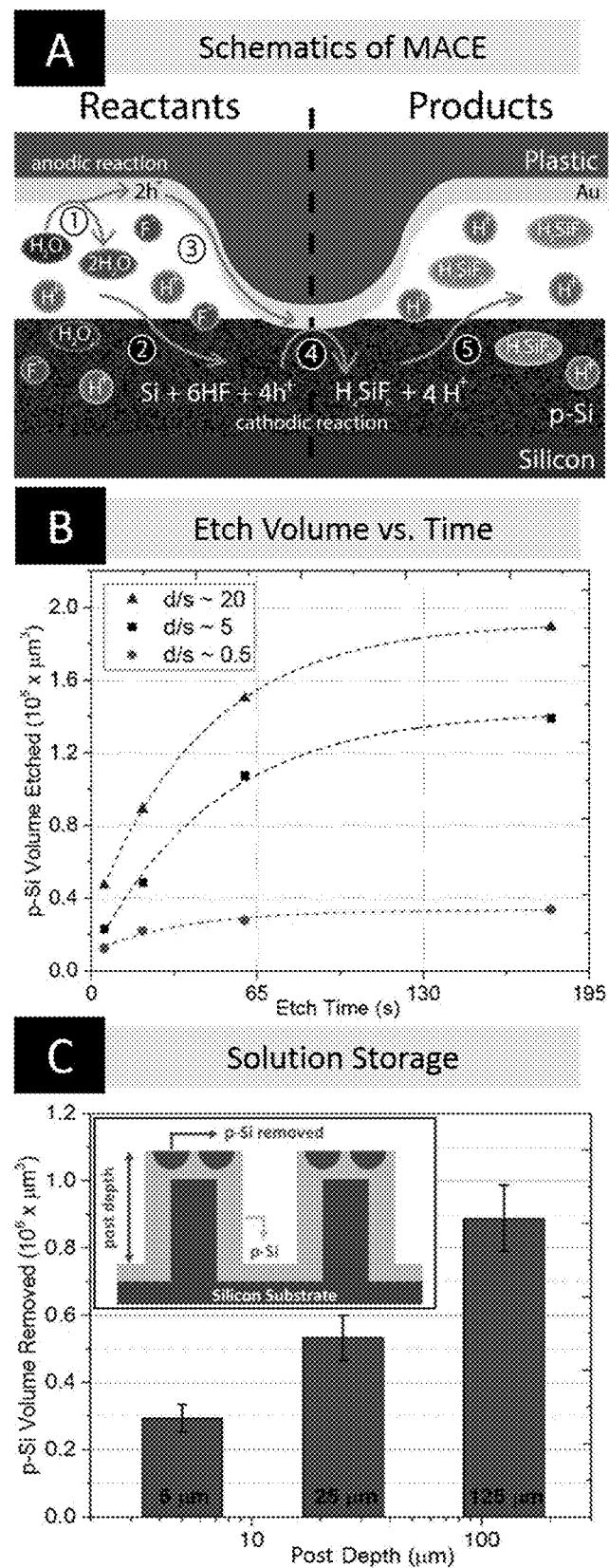
FIG. 3 part A) is a schematic, which highlights (1) the diffusion of hydrogen peroxide ($H_2O_2$) to the cathode and its reduction, (2) diffusion of hydrofluoric acid (HF) to the anode interface, (3) charge transport between the anode and cathode, (4) the oxidation reaction at the anode, and (5) diffusion of products away from the anode. B) Shown is a plot of volume of PS removed as a function of time that illustrates the depletion and diffusion limited phenomena in imprinting (the dashed lines are exponentially decaying functions fitted to each data set). C) plotted is the volume of PS removed during a single stamping operation under the same etching conditions (time, force, and ratio of HF and $H_2O_2$) for three different volumes of solution confined between stamp and substrate.

With a porous substrate, one can think of the imprinting process as a transport-limited process, with the reaction limited by the fact that the reactants and products have to diffuse through the pores to get to or from the reaction zone, as shown in FIG. 3A. To characterize the kinetics of the process, the volume of PS removed was measured as a function of etching time imprinting repeatedly for different lengths of time. FIG. 3B shows the volume of PS removed as a function of time for three thickness of porous layer to imprint depth (d/s) ratios.

For each d/s ratio, it was observed that, unlike conventional thin-film-based MACE processes, the volume of PS removed does not scale linearly with the etch time. Instead, it decreases exponentially as the imprinting process continues. At the onset, reactants trapped at the interface between stamp and substrate provide for a high material removal rate. However, these are quickly depleted, requiring additional reactants to diffuse from the surrounding solution located at a length scale of about 20-200 μm away from the etching interface, and through the porous layer to replenish the reactants at the interface, thus slowing the imprinting rate. As the imprinting progresses, the diffusion length increases, thus producing smaller increments to the volume of PS removed with each additional time increment.

Comparing across the three d/s curves in FIG. 3B, it is also found that the rate of material removal depends on the thickness of the PS. For the case of d/s about equal to 0.5, the stamp likely encountered the solid Si sub-surface during the process interval studied, resulting in the virtual stoppage of the imprinting process. The difference in the etch rates for the d/s ratio about equal to 5 and about equal to 20 cases suggests that the network of rich diffusion pathways below the interface zone play an important role in the transport phenomena associated with the process. Thicker porous layers increase the total amount of reactants present and extend the terminal etch depth.

The previous discussion suggests that the imprinting process is transport limited with the network of pores in the substrate serving to locally transport the reactants to, and the products from, the stamp-substrate interface, so as to sustain the etch reaction and keep it localized. In an imprint process, however, one is typically interested in patterning over large areas (e.g., greater than 1 cm$^2$), which would require the network of pores to support the mass transport of the reactants and the products over much longer length scales. To further understand if the local availability of reactants influences the process rates, the volume of solution confined in close proximity of the patterning interface was varied.

This was accomplished by pre-patterning the substrate with square posts (of about 400 μm width) in a square grid (of about 900 μm pitch) to depths of about 5, 25, and 125 μm with lithography and DRIE. When the stamp was brought in contact with the substrate, the voids between the square posts acted as local reservoirs of reactants for the process reaction. The posts were porosified at the same current density and time, forming a porous layer with uniform thickness (about 20 μm) beneath the post surface. This was done to ensure that the pore morphology and thickness were the same across the substrates, and, thus, were not a factor in determining the imprinting rates.

Subsequently, the substrates were imprinted under the same time (about 180 s), ρ-parameter (about 96%), and force (about 18 N). The volume of material removed is shown in FIG. 3C. It can be observed that the volume of PS removed scales linearly with the depth of the post pattern and, hence, the volume of reactants confined (and available locally) between stamp and substrate. Thus to implement a large-area, high-rate imprinting process, strategies for storing and confining sufficient reactants locally (or supplying them in close proximity to the features being imprinted) must be developed so as to sustain the imprinting/etching reaction and permit it to progress at the desired rate.

In a typical MACE configuration that uses a thin-film metal catalyst, a number of factors dictate the morphology and spatial distribution of the pores produced during the etching process. These include the doping level of the substrate, width of the features of the metal catalyst, thickness and morphology of the metal film, ρ-parameter of the etching solution, and the presence of organic solvents, for example. The ratio of the cathode area to the anode area is not, however, considered a factor thus far in the art of thin-film-based MACE, because the process configuration is such that the entire bottom surface of the catalyst is in contact with the Si surface throughout the entire etching process. Thus, with the top surface of the thin film being the cathode, the ratio of the cathode area to anode area remains constant at unity in thin-film-based MACE. In the disclosed imprinting configuration, depending on the stamp construction and geometry being imprinted, not only is this ratio is much larger at the onset of etching, but it also reduces with time as the contact interface between the stamp and substrate evolves and increases during the imprinting process.

Since the rate of reduction of $H_2O_2$ scales with the area of the cathode and given the small area of the interface between stamp and substrate (that serves as the anode), it may become difficult to localize the oxidation of Si at a ρ-parameter about equal to 75%-85%, which is typically used in thin-film-based MACE of low doped p-type Si. Thus, the delocalization of etching reaction can lead to enlarging of the existing pores and non-specific etching of the Si on the substrate (depending on, for example, the electrical fields developed, charge migration, and availability of reactants). Thus, when designing stamps for certain embodiments of the disclosed imprinting process, it becomes desirable to avoid large area ratios and, when unavoidable, compensate for it by increasing the ρ-parameter of the etching solution to reduce the rate of reduction of $H_2O_2$ (or similar oxidant).

Figure 4:
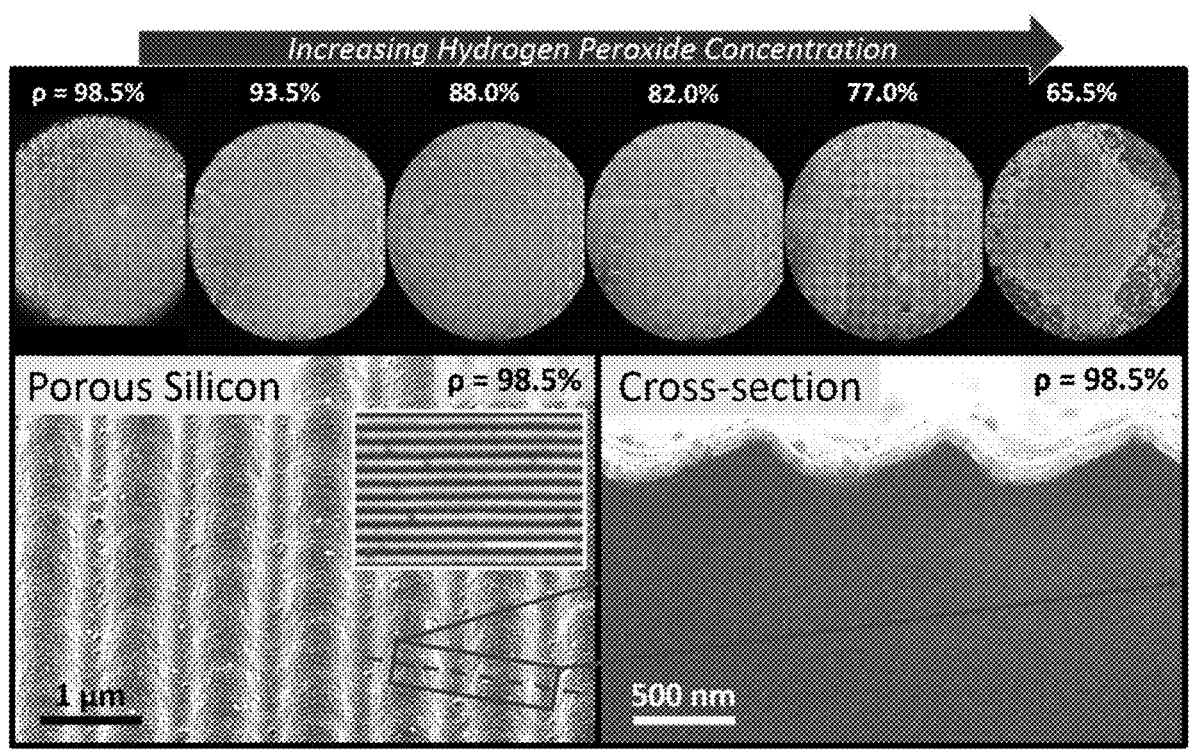
FIG. 4 illustrates an optical view (top row) of posts of PS at 2.2 times magnification after a stamping operation and as a function of the ρ-parameter (as labeled). For a reference of scale, the pitch between two posts, seen in the image as small periodic dots, is 900 μm. In the bottom row, scanning electron microscopy (SEM) images of a 30° tilted (left) and a cross-section (right) of sinusoidal patterns reveal smoothness and porous uniformity near the imprinted features. The inset in the left image depicts an optical picture of the sinusoidal grating under angled illumination.

The effects of excessive hole generation can be examined by qualitatively studying the appearance of the PS substrate before and after imprinting. FIG. 4 shows substrates imprinted with etching solution with different ρ values. Examining the color appearance of the porous substrate before and after stamping, there are no changes in the color of the porous substrates at high-ρ values (about 90%-95%), but there is a dramatic darkening of the substrates when operating at low-ρ values (about 65%-85%) or high volume fraction of $H_2O_2$. The color change is attributable to a widening of the pores of the substrate.

Figure 5:
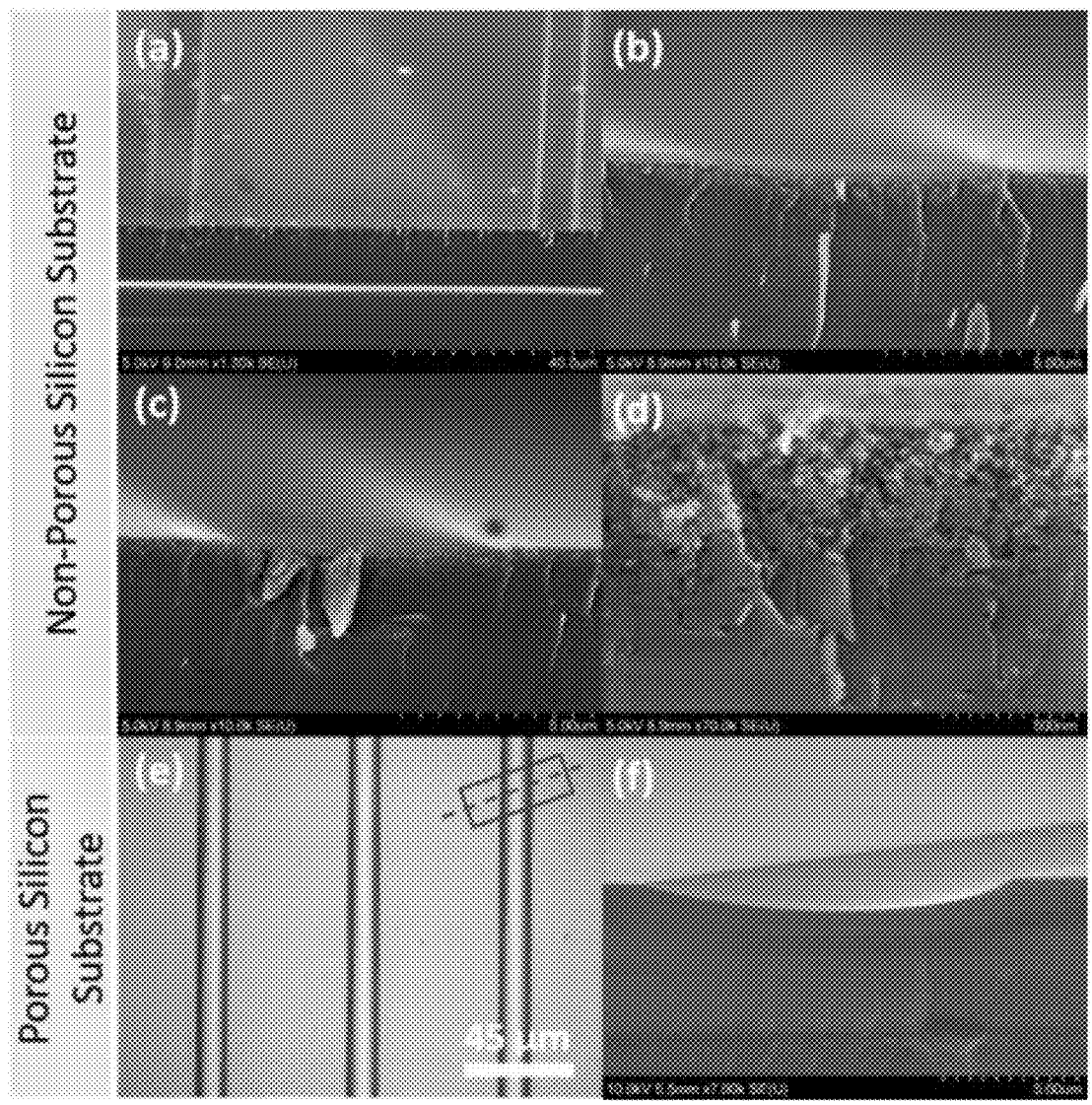
FIG. 5 shows SEM images (a-d) at different magnifications of cross-sections of Si substrates imprinted with parabolic cylinder shapes. These four images reveal the preferred porosification beneath the stamp-substrate interface, rather than the selective etching and imprinting of features with high pattern transfer fidelity. Additionally, image (e) depicts a top-down optical image of parabolic cylinders imprinted onto PS, and the corresponding cross-section (direction shown in red) is depicted in SEM image (f).

Further, in the high-ρ regime, scanning electron micrographs (SEM) of the cross-section of the imprinted features confirm the uniform porosity surrounding them (FIG. 4), and its pore size cannot be resolved under high-resolution SEM images. Thus, it can only be stated that the pore sizes are below the resolution of the instrument, which is about 5-10 nm. This trend is also observed in thin-film-based MACE. However, in the case of imprinting with etching solutions having low-ρ values, the imprinted features in the PS also do not resemble those on the stamp and instead the surface is roughened (FIG. 5).

PS Imprinting as a Manufacturing Process

For the disclosed imprinting process to be deployed as a practical micro- or nanofabrication process, it is important to examine process characteristics, such as resolution, accuracy, repeatability, defect density, and patterning speed. The former was determined using a soft polyethylene linear holographic film with a nearly linear sinusoidal pattern whose pitch and amplitude were about 1,000 nm and about 250 nm, respectively.

Figure 6:
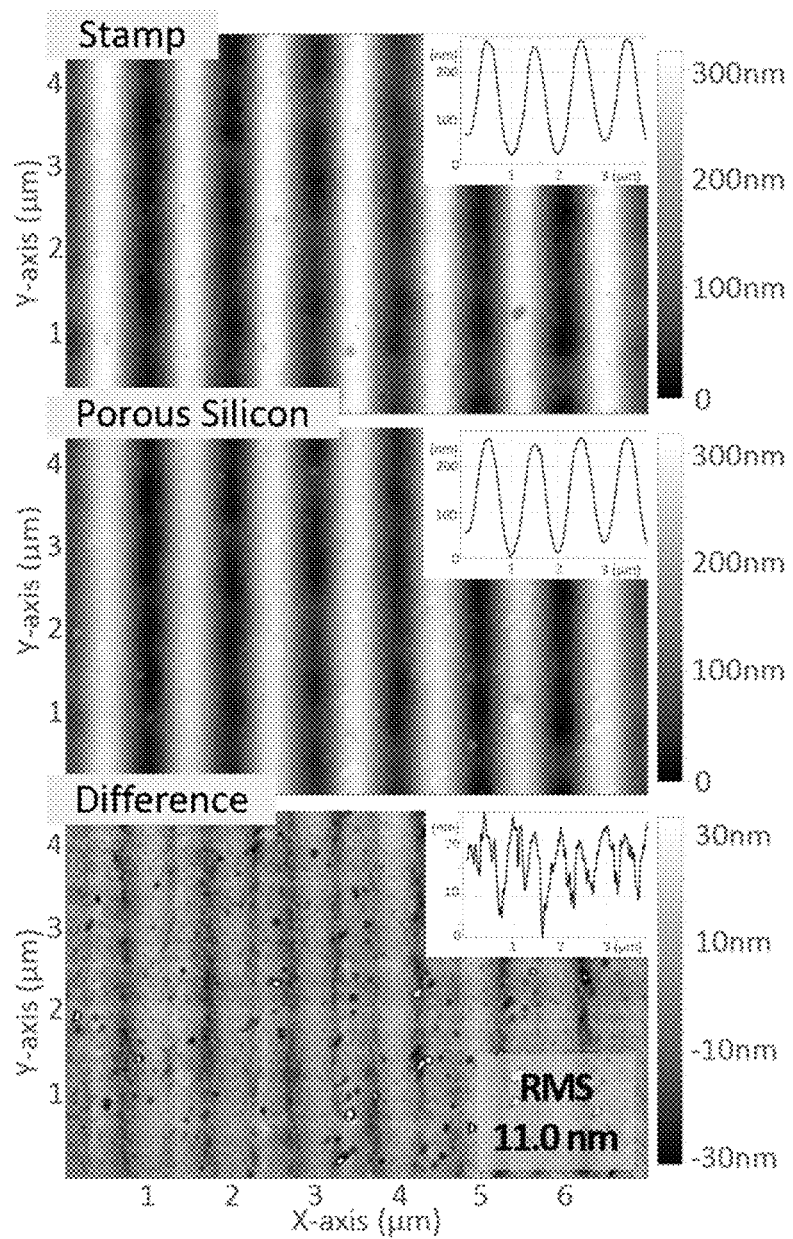
FIG. 6 illustrates a determination of the resolution of Mac-imprinting with a near-sinusoidal test stamp. The images depict AFM scans of the stamp (top) and substrate (middle) at the complementary location. The difference between them after plane leveling (bottom) is also depicted, although the stamp scan (top) was inverted such that its peaks and valleys depicted correspond exactly to the same location on the substrate (middle) image. The insets show the cross-sectional profile of the corresponding AFM scan. The root mean squared (RMS) value of the bottom surface plot is also shown.

The film was cleaned and coated with a catalyst (as detailed below) and used for imprinting. FIG. 6 shows images of precisely complementary locations on the stamp and substrate with a high-resolution AFM. The 3D point data of both stamp and substrate were leveled with only a plane, the point set corresponding to the stamp was overlaid on the point set for the substrate, and subtracted from it to produce the third image in FIG. 6. It was found that the RMS of the difference in heights between complementary points in the two images was about 11.0 nm (FIG. 6). If the resolution of the process is taken to be two times this RMS value, then it is consistent with the best resolution results achieved with thin-film-based MACE research. Except, in cases in which the pore size exceeds the resolution of the technique, the RMS value and resolution will be limited by the pore size.

Other process characteristics are discussed qualitatively. Accuracy, defect density, and precision may be affected by the degradation of the polymeric stamp, which may become evident after about 10-15 uses, due to delamination of the catalyst thin-film from the stamp. In some cases, small grains of Au fall into the sample after each stamping operation and large portions may peel off, typically after about the tenth imprinting cycle, depending upon the loading conditions. Finally, uniformity of etch depth may be largely dependent upon alignment and flatness of the stamp. This could be greatly improved with the development of a step-and-repeat automated system.

Figure 7:
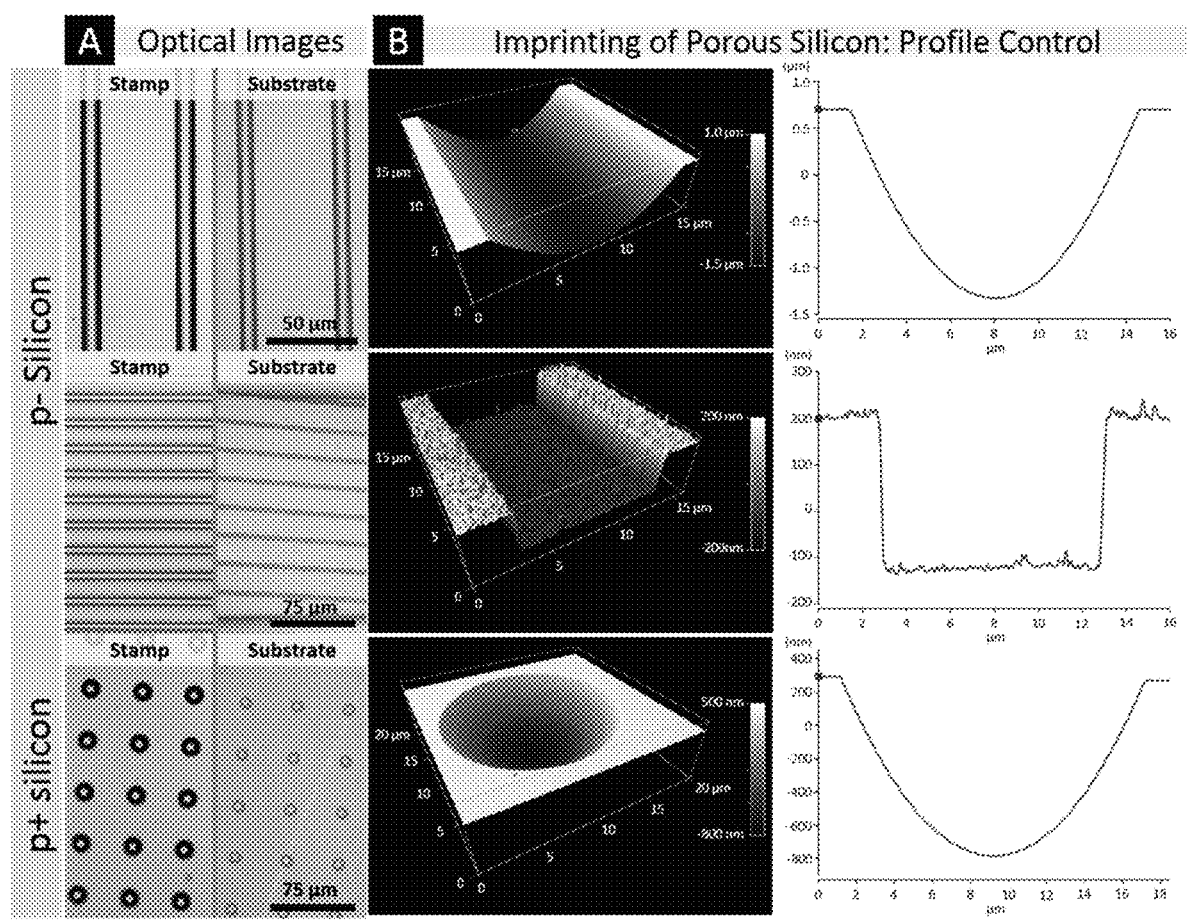
FIG. 7 illustrates A) optical top-down images of stamps before imprinting, and of corresponding substrates after imprinting, for different 3D geometries: parabolic cylinder (top), trenches with straight sidewalls (middle), and paraboloids (bottom). B) Shown are 3D plots of AFM scans of the corresponding PS surfaces. The first two rows of images depict patterning of p− (1-10 ohm cm), while the third row depicts p+ (0.001-0.005 ohm cm) PS substrates.

To assess the versatility of the imprinting process, stamps were made using the fabrication process detailed below for imprinting parabolic cylinders, paraboloids, and straight wall channels in PS. FIG. 7 shows optical images of the stamp and imprinted porous substrate, as well as AFM profile scans of the imprinted features and cross-sectional graphs. During imprinting of the straight wall channel, a DRIE micromachined Si trench was used as the stamp instead of the polymeric stamp previously described.

A thicker film of chromium (Cr) (about 200 nm) was sputtered onto the stamp as both an adhesion layer and a protection layer for the Si stamp. While the imprinting had a high pattern fidelity in some areas of the porous substrate, stamp degradation due to the catalyst being undercut and peeling off onto the substrate surface was observed after the first stamping operation. Au particles peeled from the stamp, which resulted in roughening of the surfaces of the imprinted substrate.

Additionally, imprinting was demonstrated in p-type PS substrates with two distinct doping levels (about 0.001-0.005 ohm cm and about 1-10 ohm cm) porosified under the same current density (about 135 mA cm$^{-2}$) and time (about 120 s). The resulting pore sizes of high and low doping samples were located in the sub-50 nm and sub-5 nm ranges, respectively, and thus belonged to the microporous and mesoporous IUPAC classifications (see FIG. 8).

The PS fabrication art provides a number of methods for controlling the pore morphology. Inherent to all these methods is the creation of pore pathways connected to the PS surface. However, not all of them generate an interconnected network of pores that allow for lateral diffusion. In fact, some pore formation techniques create pores that are directional and isolated from each other. While FIG. 7 shows successful imprinting into a limited set of PS morphologies, MACE has been demonstrated to anisotropically etch Si wafers of all orientations, doping types, and levels. Thus, as long as the substrate has a network of interconnected pores that allows diffusion to take place laterally (perpendicular to the motion of the stamp), the disclosed technique could be extended to a wide range of morphologies and doping type of PS.

Characterization of Microconcentrators

Figure 9:
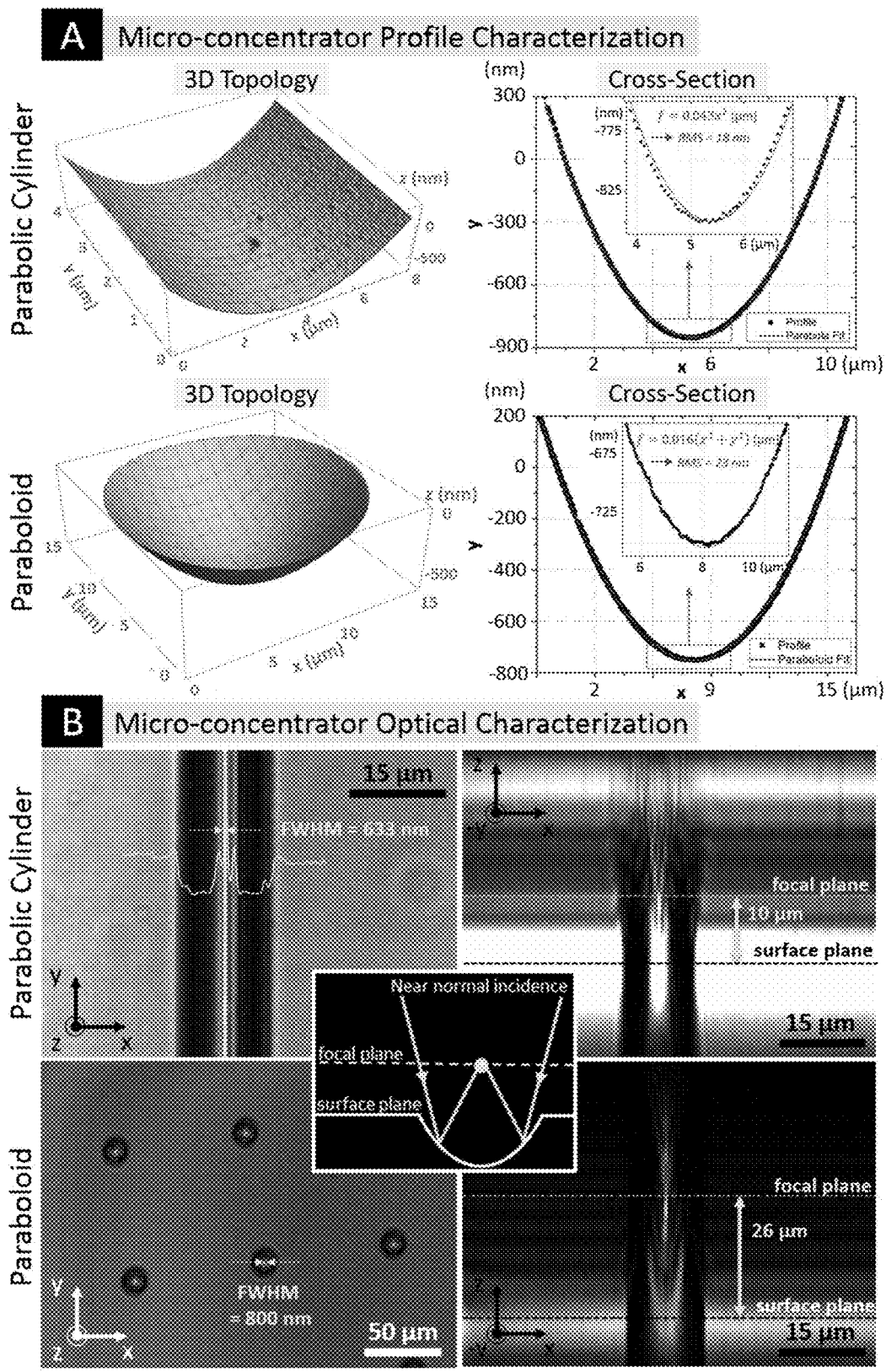
FIG. 9 illustrates profiles and optical characterization of microconcentrators manufactured into PS. The top and bottom rows of each part depict data corresponding to a parabolic cylinder and a paraboloid, respectively. A) AFM scans of the substrate (left) and its cross section (right) are plotted, along with a fitted parabolic cylinder or paraboloid equation (only the curvature term is displayed). B) the left images depict an optical section of a reflected light (405 nm) image in the XY plane together with an intensity distribution (yellow line inset) at the focal plane of the parabolic cylinder or paraboloid, highlighting a tight focal spot. A cartoon (inset) also shows the incident light angle interacting with the parabolic surface. The right images show the intensity distribution along the XZ plane of the reflected light image, highlighting the XY plane where the focal spot is located; the shape of the intensity distribution confirms the parabolic shape of the cavities.

The advantages of low roughness (mirror finish) surfaces with high fidelity shapes can be best demonstrated by constructing a microscale optical concentrator whose conformance to a parabolic shape directly defines its quality. Stamps for imprinting parabolic cylinders and paraboloids can be manufactured by reflowing photoresist patterned into lines or dots, respectively. Such a stamp was used to pattern PS using the method described herein. The surfaces produced were coated with an about 30 nm layer of a reflective material (e.g., AuPd, Pd being palladium) to form a microconcentrator (FIG. 9). FIG. 9A shows AFM scans of the surface profile of these geometries replicated onto PS. Using least squares, each profile was fit to a parabolic cylinder and paraboloid with a focus of about 5.8 μm and about 15.7 μm, respectively, and an RMS error of about 18 nm and about 23 nm, respectively.

Next, the micro-concentrators were illuminated with a collimated laser beam at about 405 nm and the reflected light off of the microconcentrators was imaged at different focal planes through the Z dimension (out-of-plane), utilizing the inherent optical sectioning property of the de-scanned reflected light through a tight (about 0.2 a.u.) pinhole with a multi-photon confocal microscope (FIG. 9B). Diffraction limited optics, together with shape variations due to aberrations from a perfect parabolic profile, lead to spatial widening of the full-width-half-maximum (FWHM) of the Gaussian-shaped intensity profile. The measured focal plane was identified to be about 10 μm and about 26 μm above the surface and the FWHM of its focal spot, measured to be about 633 nm and about 800 nm (FIG. 9B).

These measurements are very close to the theoretical lateral resolution of the confocal microscope under the setup, which was calculated to be about 715 nm. The difference between the focus of the parabolic shape and the position of the focus measured in the confocal microscope setup is attributed to the numerical aperture (about 0.3) of the lens used during imaging, which deviates from the normal incidence assumption. The ability to focus light to a spot whose lateral dimension is only about 1.5 times its wavelength without significantly distorting the electromagnetic wave front suggests a high quality of the shapes produced by the nano-imprinting approach.

Advantages

Mac-Imprint demonstrates for the first time the ability to imprint and pattern PS without the need for mechanically crushing the porous material to be removed. As a result, it is capable of producing well-defined non-planar features with mirror quality surfaces. Because of differences in configuration that influence the transport of reactants and the cathodic and anodic reactions, the Mac-Imprint process behaves differently from the thin-film catalyst MACE process. The process exploits the existing network of pores in the material to transport reactants to the stamp-substrate interface, localizing the etching of Si at it, and accomplishing the imprinting of the stamp geometry into the substrate with sub-20 nm resolution. The porous material is capable of sustaining mass transport of reactants over length scales of several tens of microns and, thus, of localizing the etching.

Material removal rates were observed to drop when a large enough volume of reactants was not locally available or the thickness of the porous layer approached the depth to which imprinting is performed. Thus, for implementing Mac-Imprint, careful considerations of how to locally store and periodically resupply reactants to the vicinity of the stamp-substrate interface may be necessary. The large and changing difference in the effective areas of the cathode and anode require consideration of the composition of the etch solution. The absence of reactant diffusion may lead to non-localized pore formation that may change or destroy the morphology of the substrate.

Notwithstanding these technical challenges, Mac-Imprint brings novel capabilities for imprinting and patterning of micro- and mesoporous Si. It is capable of imprinting curved surfaces, as demonstrated by the fabrication of parabolic micro-concentrators with widths of about 15 µm capable of focusing light to a spot whose FWHM was a factor of about 1.5 the input wavelength. Further, it has potential as a high throughput, economical process by avoiding lithography steps during production through the reuse of the imprinting stamp. Given the interest in PS in biosensing and in micro-optics as photonic crystals and microcavities, and the inability of conventional lithography-based processes to pattern it, Mac-Imprint provides an important missing capability in potential manufacturing pathways.

Embodiments of the invention add new manufacturing capabilities to existing chemical semiconductor microfabrication techniques. These capabilities rely solely on the catalysis of wet chemical reactions to selectively etch bulk semiconductors (e.g., wafers), avoiding the use of processes that involve plastic deformation and high-temperature processing. Currently, key challenges prevent scalable and low-cost micro- and nanopatterning of semiconductors, such as low-dimensionality in geometrical control (i.e., 1D vs. 2D vs. 3D), low resolution, cost, and low-throughput. A novel imprinting platform was developed to directly pattern PS and single-crystal Si that makes significant progress towards addressing these challenges. This platform offers new capabilities, such as sub-10 nm resolution, centimeter-scale parallelization and 2.5D geometrical control. Further, it can operate at room temperature and can utilize earth-abundant and low cost chemicals, all of which lower the processing costs. Also, the same catalytic stamp may be reused multiple times, bypassing the use of single-use expendable catalysts. The versatility of this direct imprinting technique is demonstrated by, for example, its ability to produce curvilinear and complex 2.5 D features (e.g., paraboloids, parabolic cylinders, sinusoidal waves, and straight sidewall channels). Typically, to obtain these shapes with standard techniques, it would require the combination of two processes: gray scale lithography and deep-reactive ion etching. Embodiments of the present invention can in a single step pattern these geometries, potentially lowering the manufacturing cost of products requiring these patterning capabilities. Further, pattern repeatability and resolution is intrinsically higher with chemical imprinting than competing methods, such as mechanical methods. Chemical imprinting can be done in ambient conditions without the need for vacuum processing and may require a simpler and less expensive apparatus than dry etching methods.

Based on the underlying mechanism of metal-assisted chemical etching (MacEtch), certain disclosed embodiments use a pre-patterned polymer stamp coated with a noble metal catalyst to etch semiconductors immersed in an HF-oxidizer mixture. In contrast to methods that rely on templating techniques to pattern a catalyst (such as photolithography, e-beam lithography, interference lithography, thin-film dewetting, nanosphere lithography, and block-copolymer lithography), in which the catalyst cannot be reused and a new noble metal thin-film catalyst must be patterned for each new sample, the disclosed invention can reduce complexity, generate less waste, and improve cost and scalability, because it avoids the need for lithographic patterning of the metal catalyst for each substrate. Instead, the catalyst is attached to a substrate, and then the catalyst can be retrieved after each imprinting operation and reutilized for multiple substrates.

Furthermore, by attaching the catalyst to a stamp, the catalyst is mechanically constrained, which allows for the creation of arbitrary 2.5D shapes. The pattern repeatability is also high since the catalyst motion is mechanically constrained and pattern shape cannot undergo large deformations. Further, since it uses chemical catalysis instead of relying on mechanical deformation, the stamps of the invention undergo two orders of magnitude less pressure and may have much longer lifetimes than by mechanical imprinting methods, and the disclosed invention can achieve higher resolution and low edge roughness compared with mechanical imprinting of PS. These characteristics are highly desirable for micro-optics and sub-wavelength photonics applications in Si photonics and biosensing.

The present invention is also improved from the standpoint of compatibility. In contrast, lithographic patterning must be compatible with the substrate; PS substrates, for example, are often considered incompatible substrates for lithography and dry etching, often leading to poor etching results (i.e. poor resolution). This limitation is true for both traditional MacEtch and dry etching techniques.

The present invention also provides greater control to the catalyst motion in three dimensions. While previous methods may have had some success in controlling the catalyst etch direction to achieve 3D features via magnetic-assisted MacEtch and engineering the catalyst motion, these approaches have limited control over the span of 3D features they can produce and have not been demonstrated to have high repeatability and spatial uniformity.

This invention addresses the aforementioned issues by the development of a high-throughput, chemical imprint process called "Mac-Imprint." Like traditional MacEtch, it is capable of centimeter-scale parallel patterning with sub-20 nanometer resolution. But unlike the current implementations, as mentioned above, it avoids the need for lithographic patterning of the metal catalyst for each substrate to be patterned by using a reusable imprinting stamp. Also, it can pattern 2.5D features with high pattern fidelity and repeatability. Further, unlike reported purely mechanical imprinting processes for PS, it does so with minimal mechanical forces and no resulting plastic deformation or residual stresses, leading to higher resolution, and potentially higher stamp lifetimes.

Uniquely, the disclosed fabrication method can have an enormous impact in improving fabrication methods for optoelectronic devices and interconnects, biosensors, sub-wavelength photonics, and microoptics, for example.

Non-Porous Substrates

There are at least two configurations of Mac-Imprint that are disclosed herein: (a) imprinting with impervious stamps, and (b) imprinting with porous/permeable stamps (FIG. 10).

The first configuration is described above and in the following reference, which is incorporated herein by reference in its entirety: Azeredo, B., Keng Hsu, Placid Ferreira, "Direct Electrochemical Imprinting of Sinusoidal Linear Gratings into Silicon," Proceedings of the 2016 Manufacturing Science and Engineering Conference, July, 2016, Blacksburg, Va.

Figure 10:
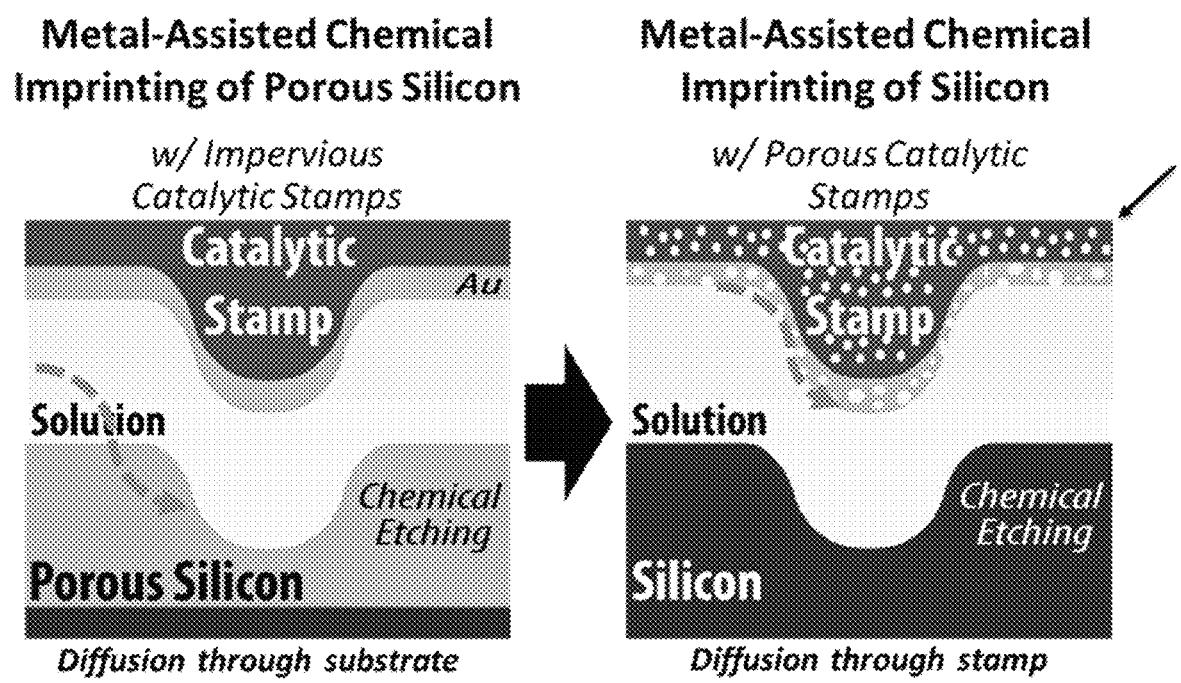
FIG. 10 shows schematics of Mac-Imprint configurations.

The first configuration was described above and demonstrates the ability to nanostructure PS wafers with impervious stamps (left part of FIG. 10). However, the fundamental limitations of this technique are understood by a set of key experiments. The process is limited by the local depletion of the reactants and diffusion. In this reaction, reactants may need to be stored in the voids filled with liquid that is confined between stamp and substrate. Further, mass transport of reactants must take place through permeable media to access the etching front. Since the stamp is impervious, the stamp cannot store reactants nor provide a pathway for diffusion. Thus, imprinting with impervious stamps may only work to pattern PS (and potentially other porous semiconductors) because the network of pores in the substrate provide the required chemical storage space and diffusion pathways.

The reference noted above addresses these aforementioned issues by the use of porous stamps. In short, without the use of porous stamps, chemical imprinting of non-porous Si may lead to poor pattern fidelity. The use of a permeable catalyst/stamp to the process, described above (i.e., Mac-Imprint), removes the need for having porosity in the substrate. By using porous stamps, not only is it possible to pattern PS, but also non-porous Si. This is achieved because the permeable stamp can altogether store reactants and products, and it provide pathways for diffusion (i.e. mass transport) through its network of pores. Thus, it is possible to imprint into Si and other semiconductors (non-porous), which dramatically extends the applicability of this technique. The reference noted above explores the use of one specific class of porous materials, namely porous Au, for preparing porous stamps.

Figure 11:
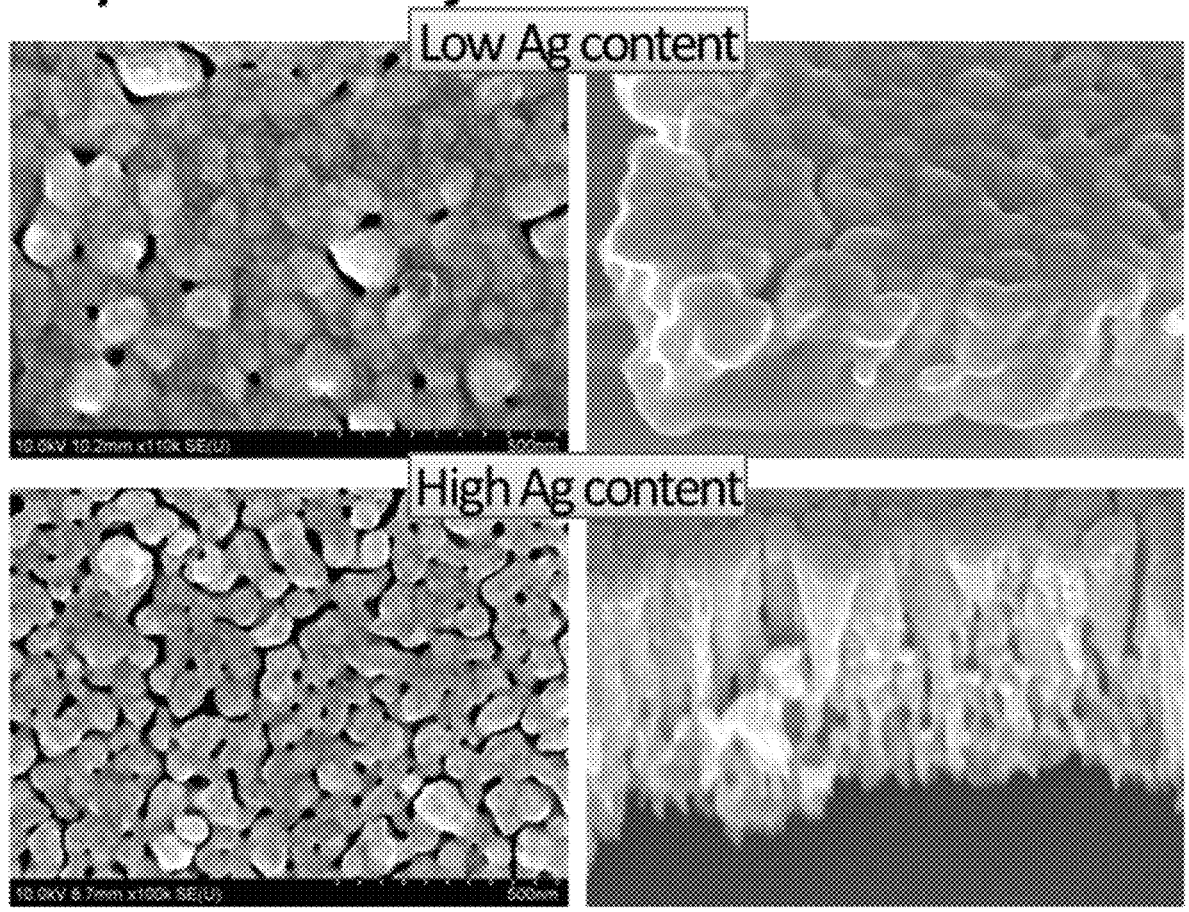
FIG. 11 shows images of the synthesis of porous gold films via thin-film dewetting.
Figure 12:
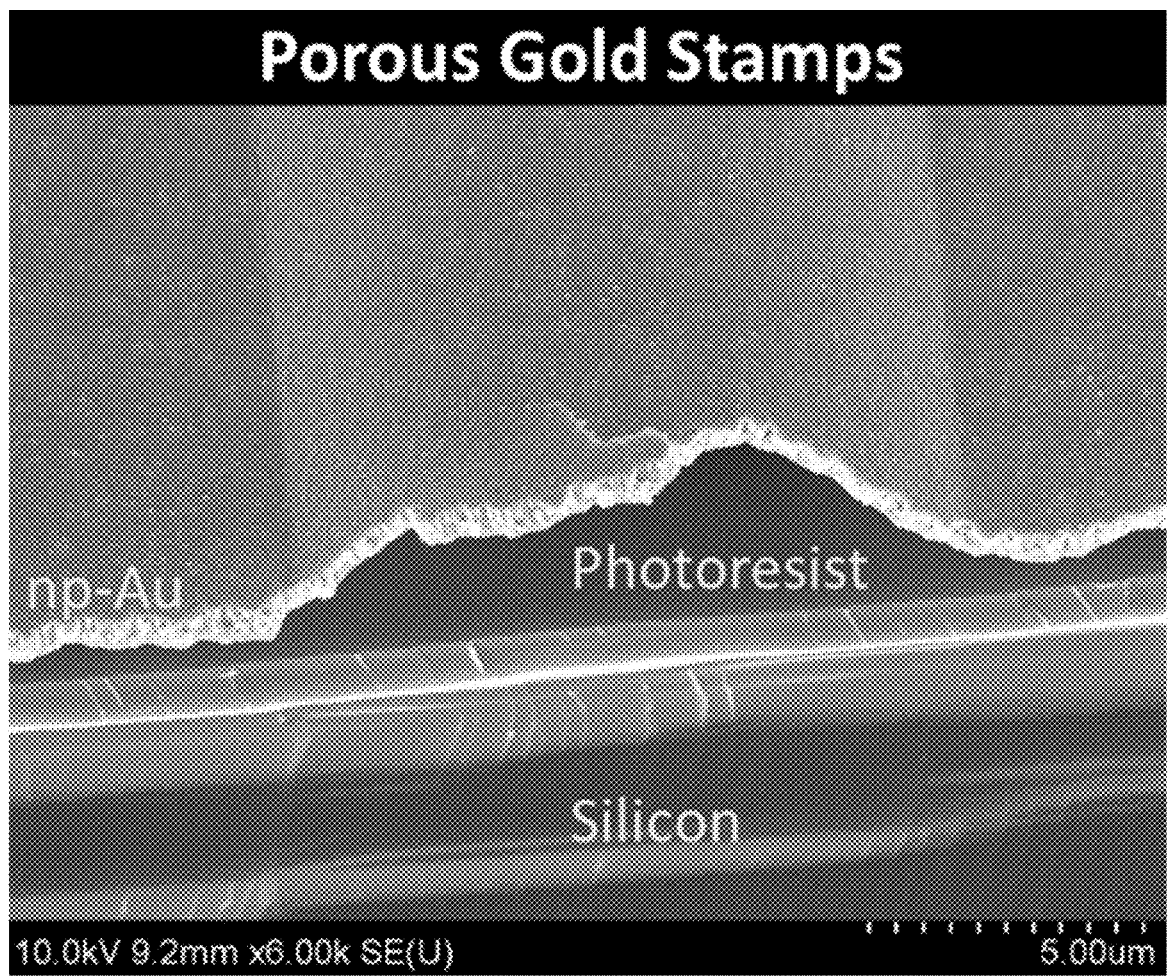
FIG. 12 shows a cross-sectional SEM image of a porous gold film synthesized onto a photoresist pattern.

Experimental data, presented herein, has been collected to back these arguments and realize the imprinting of Si. First, impervious polymeric stamps were fabricated with standard lithographical patterning of various geometries (i.e., parabolic cylinders and paraboloids), as described above. Subsequently, impermeable polymeric stamps were coated with porous Au catalysts. This was accomplished by a subtractive process called thin-film dealloying in which Au and silver (Ag) are co-sputtered and, subsequently, Ag is removed by a chemical etching process in nitric acid. The less noble metal (silver in this case) is selectively etched in nitric acid, resulting in a thin-film of porous Au (FIG. 11). This work was performed by reproducing benchmark methods for preparing porous. Dealloyed Au films of thicknesses in the range of 400-800 nm were uniformly coated onto polymeric stamps, as shown in FIG. 12.

Figure 13:
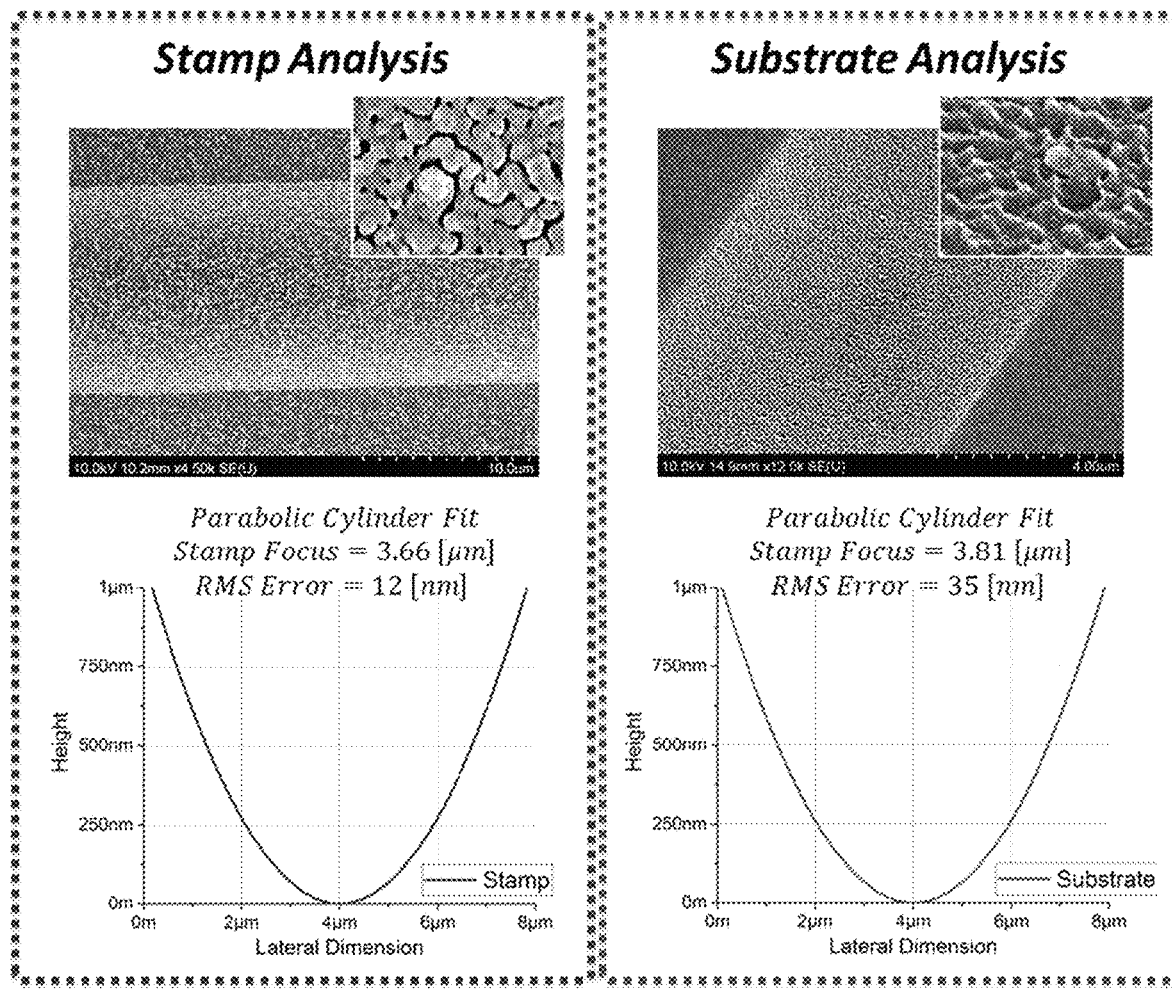
FIG. 13 illustrates an analysis of the topology of a stamp (left) and substrate features (right) via SEM (top) and AFM (bottom). SEM data is presented for different non-complimentary locations, and the insets depict the morphology of the surface at the same magnification. The figure shows that the imprinted surface has a texture that is complimentary to the pitted surface of the porous gold sample. This demonstrates the high resolution of the disclosed process, since the pore sizes shown in the figure are in the 10-30 nm range. The AFM data is presented at complimentary locations on the stamp and substrate. Stamp and substrate features are both nearly parabolic, and the focus matches with unprecedented accuracy.

Subsequently, stamps with porous Au films were used for imprinting under the same conditions (i.e. chemical ratio of oxidizer and HF, oxidizer type, pressure, etching time, temperature), as described above. The pattern shape fidelity was analyzed by measuring the topology of stamp and substrate at complimentary locations. In contrast to imprinting with non-porous stamps, high pattern fidelity can be achieved, as shown in FIG. 13. Features in stamp and substrate are parabolic in shape, and its focus matches to a high degree of fidelity, which has never been achieved before with impervious stamps.

Figure 14:
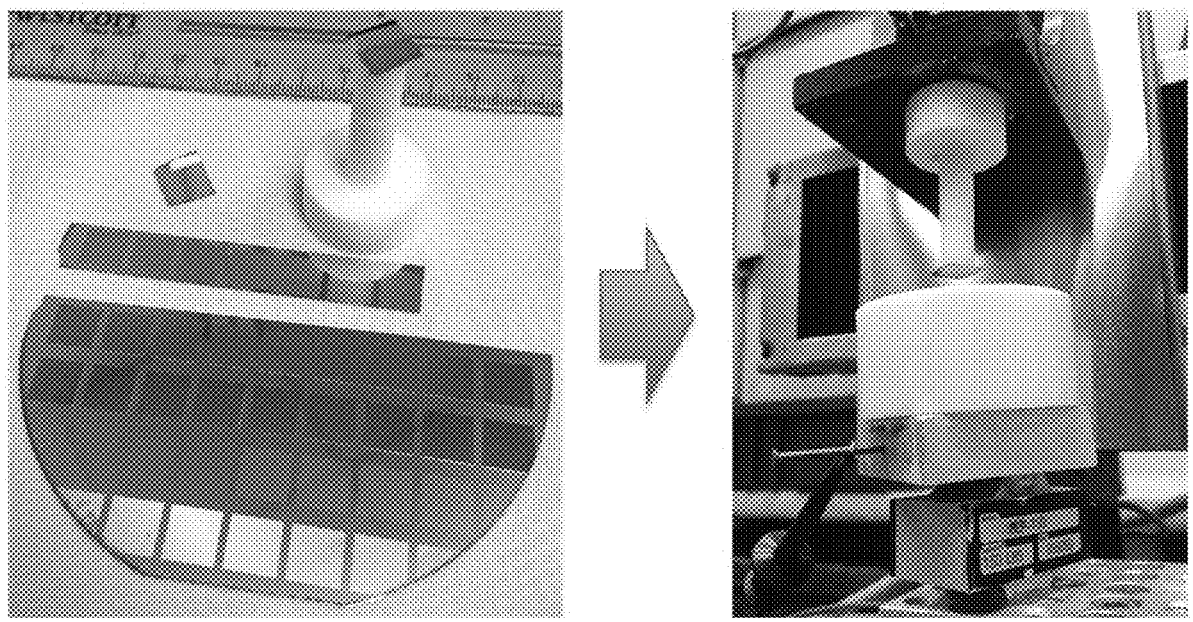
FIG. 14 illustrates sample preparation, mounting, and imprinting hardware. The left image depicts a wafer after patterning coated with catalyst, after cleaving into 1 cm$^2$ chips, and after mounting onto a holder. The right image depicts a stamp secured by a Teflon holder about to be brought into contact with Si substrate inside a chemical reservoir/cell.

To reiterate, two general configurations have been demonstrated and tested: (a) imprinting with impervious stamps and (b) imprinting with porous/permeable stamps. Two distinct experimental steps are necessary to perform imprinting: (a) stamps may need to be prepared in a cleanroom via lithography and thin-film deposition, and (b) stamps are mounted onto an imprinting apparatus. A standard and simple imprinting platform was built to demonstrate the concept of chemical imprinting (FIG. 14). Successful shape transfer (i.e. pattern fidelity) was obtained during imprinting of PS substrates (with impervious stamps) and non-porous Si substrates (with porous stamps). Pattern fidelity was confirmed by characterizing the stamp and substrate shape at complimentary locations on stamp and substrate. The imprinting area has been demonstrated for areas as large as approximately 1 $cm^2$, although larger areas may be possible.

Figure 15:
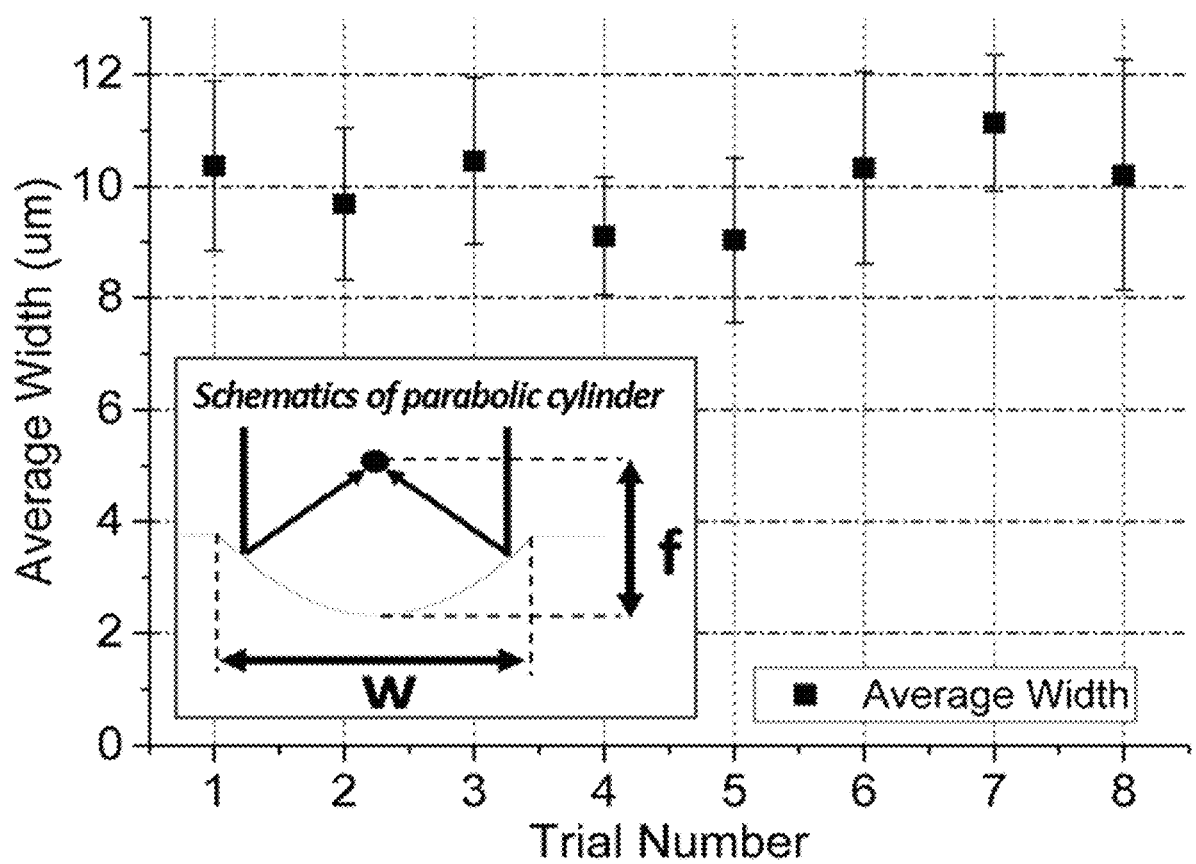
FIG. 15 shows a plot of width variations across multiple identical imprinting cycles. The solid dots represent a simple average of about 40 measurements collected at random locations across each sample. The error bars represent two standard deviations of the width variations across the sample.

Further, the pattern repeatability was examined over multiple imprinting cycles. Stamps with parabolic cylinders were prepared and imprinted under same conditions of pressure, temperature, time, chemical ratio of species. Eight imprinting cycles were performed and the feature size was measured across the entire imprinting area for each substrate. The feature size was averaged for each sample and its standard deviation, representing variations across the sample, are represented by error bars in FIG. 15. This experiment shows that the average width varies about 10% its global mean in certain embodiments. This demonstrates that this is a highly repeatable process, even without the use of sensing or closed-loop control systems, which would be expected to further enhance the repeatability.

An automated tool capable of handling wafers greater than 8 inches can be developed and is contemplated herein. It may be necessary to maintain uniform contact between stamp and substrate and to develop an automated fluidic system to flush chemical solution in and out of the chemical imprinting reservoir.

Additional data on the differences between imprinting PS and non-porous Si substrates is presented below. To contrast such differences, the two types of substrates were imprinted using the same stamp (parabolic cylinder) and stamping conditions of force, ρ-parameter, and time. AFM profiles of the imprinted non-porous substrate is shown for different etching cycles in the left half of FIG. 2. The evolution of the profile in time does not resemble the shape of the stamp, supporting the argument of mass-transport limitation in such cases as described above. On the right half of the image, the imprinted shape has a parabolic shape for short and long etches, highlighting the effect of pores in enabling the diffusion of reactants and products through its network of pores.

In the case of non-porous Si substrates, instead of the directional and selective imprinting of the features, a pattern of pores develops around the catalyst-stamp interface, as depicted in the SEM images of FIG. 5. The limited mass-transport leads to non-localized porosification of Si and quickly depletes the supply of reactants, limiting the depth of etched patterns to the 100-200 nm level.

Figure 16:
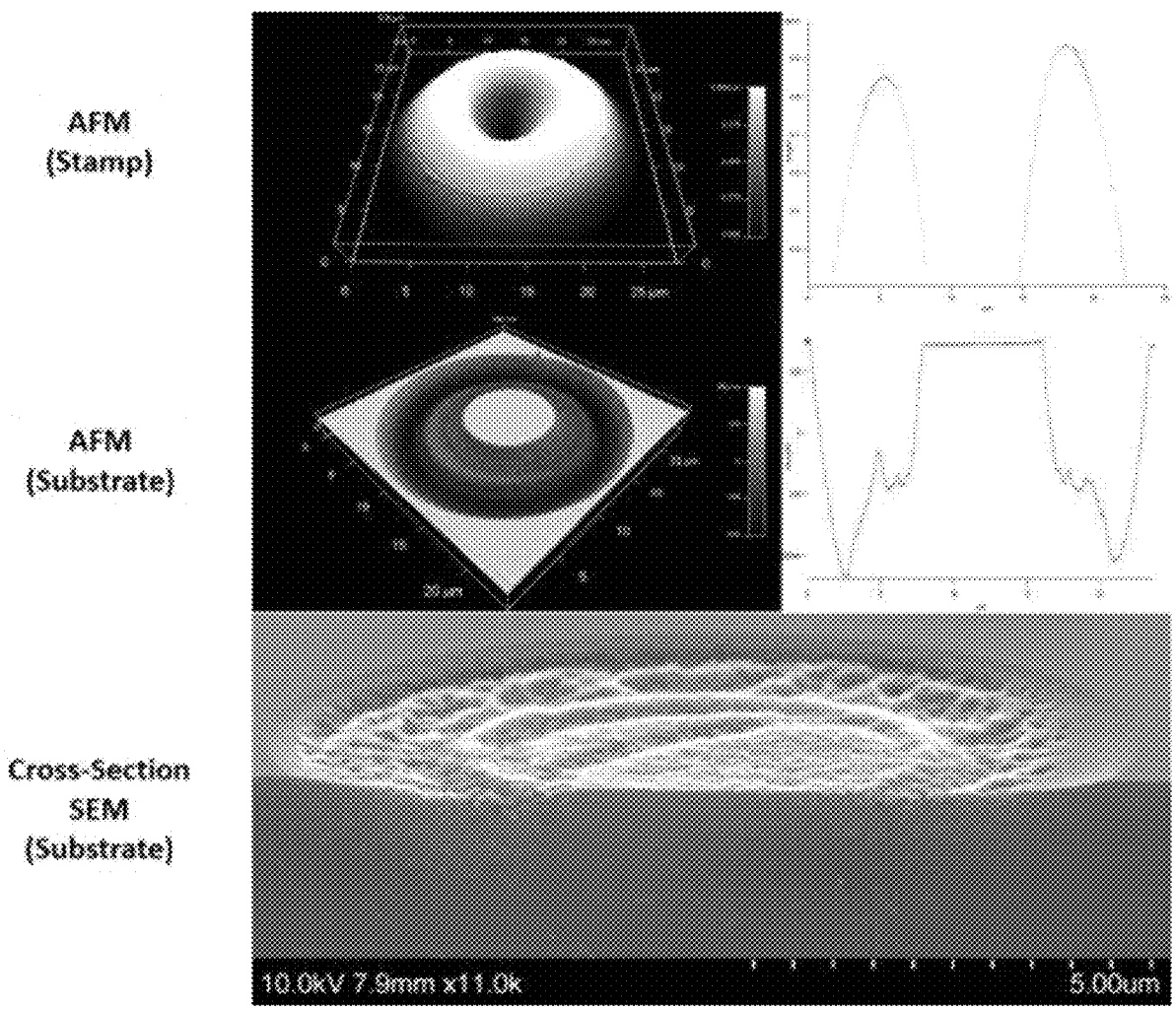
FIG. 16 depicts AFM scans of a stamp (top row) and a non-porous Si substrate (middle row) after stamping. On the left is shown an AFM 3D profile, and on the right is shown the cross-section of the pattern. The profile is not transferred. Instead, an accelerated etching rate around the pattern develops, forming what it is referred to as a "double dip" pattern. In the bottom row, a representative SEM cross-section depicts the pore distribution near the edge.

The "double-dip" pattern often obtained with stamping into non-porous Si is shown in FIG. 16. A ring with parabolic cross-section shape was used to imprint non-porous Si. Accelerated etching around the outer edges of the contact interface is observed. These results suggest the diffusion limitations imposed by the impervious stamp and substrate limiting the progression of the etching at the contact interface and rather in the surrounding domain.

Figure 8:
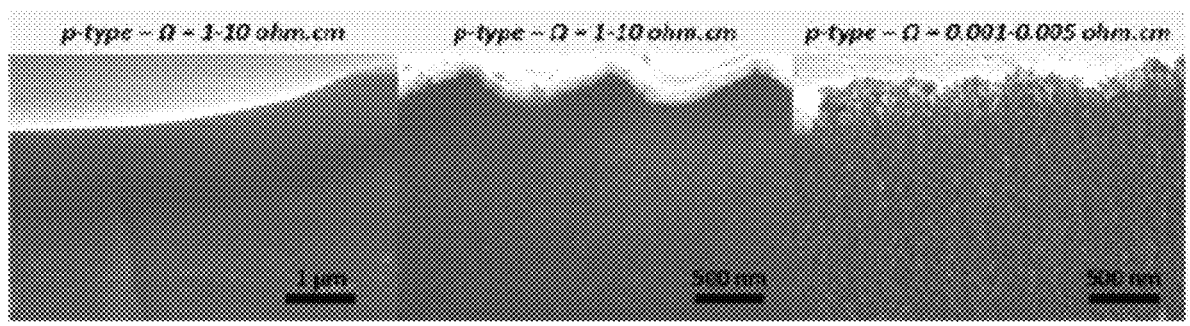
FIG. 8 illustrates a pore size characterization. The left and center images depict a cross-sectional SEM of p− silicon, while the right image depicts p+ substrates.

It is evident from FIG. 8 that the resulting pore size of p− and p+ substrate lies in the microporous and mesoporous domain according to IUPAC classification.

Examples

It should be kept in mind that the following described embodiments are only presented by way of example and should not be construed as limiting the inventive concept to any particular physical configuration.

Stamp Preparation

Stamps were manufactured in two different methods: the first used photolithography, while the second used a micro-machined Si chip. The first method started by spinning a 3 µm thick layer of AZ1518 photoresist (PR) supplied by MicroChemicals onto a 4 in (100) Si wafer. All wafers were float zone, polished, and p-type (B dopant, B being boron), and supplied from WRS Materials, Inc. Wafers were degreased and cleaned with standard RCA-1 procedure prior to pore formation. The wafers had resistivity in the range of about 1-10 ohm cm. This first layer was hard baked at 150° C. for 40 min, and then a second layer was patterned by lithography and also cured at 150° C. for 1 h. This curing was performed to get the patterned PR layer to reflow. Subsequent observations and measurements confirmed that the reflow resulted in a parabolic cross-section of features in this layer. A variety of patterns were manufactured using different photolithography masks. Au (100 nm) as a catalyst and Cr as an adhesion layer (10 nm) were sputtered onto the PR patterns.

In the second approach, arrays of lines and dots were fabricated onto Si wafers using photolithography and subsequently etched with DRIE. A layer of PR (SPR 220TM-4.5, supplied by MicroChem, Inc.) was spun, masked, exposed, and developed according to the manufacturer's specifications. After forming arrays of 10 µm wide line and dot patterns, the PR was hard baked at 110° C. for 2 min and etched in DRIE to generate negative sidewalls to a final depth of 30 µm. Then, the photoresist was removed in acetone, cleaned with an $O_2$ descum process at 200 W for 5 min. The sample was immersed in a HF bath for 2 min to remove native oxide, rinsed with methanol, dried, and immediately transferred to vacuum to minimize growth of native oxide. A thin film of Cr (200 nm) and Au (50 nm) was sputtered onto the sample to protect the Si substrate and form the catalyst. Wafers patterned with these two methods were cleaved into 1×1 cm chips and mounted to a Teflon holder using Chemtronics' CircuitWorks conductive epoxy before stamping.

Preparing PS Substrates

Si substrates (about 1-10 ohm cm) were cut to size (about 1 $in^2$) to fit into an electrochemical cell with a backing electrode. Since large-area imprinting was being performed, it was necessary to have enough etchant in the vicinity of the reaction. Therefore, square posts were patterned on these substrates using lithography followed by either a KOH etch or DRIE. The posts had a width of 400 µm and a period of 900 µm. Etching to different depths (by changing the etch time) produced posts of different heights. All results were obtained with post heights of 60 µm unless otherwise noted. This was used to vary the volume of the etching solution available for imprinting features on each post.

The backs of the substrates were coated with nickel (Ni) and annealed at 320° C. in a rapid thermal annealing chamber that focused an infrared light source on the sample (model SSA-P610C, manufactured by ULVAC-RIKO, Inc.) in $N_2$ environment for 3 min to form an ohmic contact. The cell was filled with HF (48% wt.) and a cylindrical platinum (Pt) electrode was inserted from the top and held 5 mm above the substrate. PS was produced at a current density of 135 mA $cm^{-2}$ for 120 s. This resulted in a PS layer with sub-10 nm pore sizes with a thickness of 20 µm on the surface of the substrate.

Chemical Imprinting Cycle

The substrate was immersed in a HF—$H_2O_2$ mixture with a ρ-parameter of about 90%-98%. The stamp, mounted to a Teflon holder, was brought into contact with the substrate using a servo-controlled motion state with a load-cell until a mechanical load of 17-44 N was developed. The two were held together for a prescribed amount of time, at which point the stamp was withdrawn and the imprinting/etching solution was removed. The substrate was immediately rinsed in water for 3 min and air dried for several hours before being analyzed.

Sample Analysis

The dried imprinted samples were analyzed using an AFM. The profile of the surface of the substrate was compared to that of the stamp. Given that the PS substrates took the shape of the stamp which, for all of the presently described experiments, had a parabolic shape with a pre-measured focus, optical images of the surfaces were sufficient to get a rough estimate of the volume of PS removed. The optical images were analyzed to extract the width of the imprinted patterns. By assuming spatial uniformity of the focus of the parabolic cylinders on the stamp, the volume of PS removed was estimated.

Fabrication of Sinusoidal Surfaces

A polyethylene holographic film was obtained from Edmund Optics, Inc. (part no. 40-267) with a nearly sinusoidal pattern whose pitch was 1 µm and amplitude was 250 nm, respectively. The film was sliced into 8 mm×30 mm pieces, cleaned with isopropyl alcohol, and sputter coated with a thin film of Cr and Au whose thicknesses were 10 and 100 nm, respectively. The plastic film was wrapped around a Teflon cylinder whose diameter was 1 cm and held in place with Kapton tape. The cylinder was then mounted to the stamping stage and pressed against the PS substrate with a constant load of 2.5 N for 2 min. The topology of the surfaces of the stamp and substrate was measured in an AFM with a super sharp tip (with a 3 nm radius) at the exact same complementary locations. The 3D point data of the stamp was plane leveled, cropped and inverted, and overlaid with the also plane leveled substrate data, such that small complementary defects on both surfaces were aligned. The RMS of the difference between the overlaid data sets was measured using a Mathematica code.

Microconcentrator Optical Characterization

Two samples, each containing parabolic cylinders or paraboloids, were mounted into a Zeiss 710 Multiphoton Confocal Microscope and illuminated with a continuous wave 405 nm laser. The imaging was done using the reflection mode of the system, where the light was reflected 900 at the dichroic mirror (MBS 405) and the same light reflected off of the sample was detected in air with a Zeiss 10 times EC Plan-Neofluar objective with a numerical aperture of 0.3. Since this experiment was not photon-limiting, as in fluorescence, the pinhole diameter was reduced to 0.2 Airy units (5 μm), to achieve the highest spatial resolution in a confocal system, which was calculated to be 715 nm (lateral) and 5.6 μm (axial). A stack of 68 optical sections through Z dimension (out-of-plane) in 1 μm increments were obtained to reveal the focus point of the parabolic cylinder and paraboloid. The images were analyzed in Zeiss' Zen 2008 software.

Definitions

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

The terms "comprise(s)", "include(s)", "having", "has", "can", "contain(s)", and variants thereof, as used herein, are intended to be open-ended transitional phrases, terms, or words that do not preclude the possibility of additional acts or structures. The singular forms "a", "and", and "the" include plural references unless the context clearly dictates otherwise. The present disclosure also contemplates other embodiments "comprising", "consisting of", and "consisting essentially of", the embodiments or elements presented herein, whether explicitly set forth or not.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrase "at least one of A, B, . . . and N" or "at least one of A, B, . . . N, or combinations thereof" are defined in the broadest sense to mean one or more elements selected from the group comprising A, B, . . . and N, that is to say, any combination of one or more elements A, B, . . . or N including any one element alone or in combination with one or more of the other elements, which may also include, in combination, additional elements not listed.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4". The term "about" may refer to plus or minus 10% of the indicated number. For example, "about 10%" may indicate a range of 9% to 110%, and "about 10" may mean from 0.9-1.1. Other meanings of "about" may be apparent from the context, such as rounding off, so, for example "about 1" may also mean from 0.5 to 1.4.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

Various features and advantages of the invention are set forth in the following claims.

What is claimed is:

1. An imprinting platform, comprising: a noble metal catalyst; a porous silicon semiconductor substrate; and a pre-patterned polymer stamp, wherein the noble metal catalyst is attached to the pre-patterned polymer stamp, and wherein the porous silicon semiconductor substrate has a resistivity of about 1 Ohm cm to about 10 Ohm cm, and wherein the pre-patterned polymer stamp is porous.

2. The imprinting platform of claim 1, wherein the noble metal catalyst is gold.

3. A method of patterning silicon utilizing the imprinting platform of claim 1.

4. The method of claim 3, wherein the patterning operates at room temperature.

5. The method of claim 3, wherein the catalyst-attached stamp is reused.

6. The method of claim 3, wherein a paraboloid, parabolic cylinder, sinusoidal wave, or straight sidewall channel geometric feature is produced in a single step.

7. The method of claim 3, wherein the method comprises a step-and-repeat automated system.

8. An article produced according to the method of claim 3.

9. The article of claim 8, wherein the porous silicon semiconductor substrate has been imprinted with paraboloid, parabolic cylinder, sinusoidal wave, or straight sidewall channel geometric features.

10. An optoelectronic device, interconnect, biosensor, sub-wavelength photonic, or microoptic comprising the article of claim 8.

11. The imprinting platform of claim 1, wherein the noble metal catalyst is mechanically constrained on the pre-patterned polymer stamp, allowing for the generation of complex 2.5D geometric features including paraboloids, parabolic cylinders, sinusoidal waves, and straight sidewall channels.

12. The imprinting platform of claim 1, wherein the porous silicon semiconductor substrate is imprinted with a geometric feature of the pre-patterned polymer stamp at a resolution less than 10 nm.

13. The imprinting platform of claim 1, wherein the porous silicon semiconductor substrate comprises pores having diameters of less than 5 nm.

14. The imprinting platform of claim 1, wherein the porous silicon semiconductor substrate has a surface thickness of about 20 μm.

15. The imprinting platform of claim 1, wherein the porous silicon semiconductor substrate is generated under low Boron doping conditions.

* * * * *